United States Patent
Wang et al.

(10) Patent No.: US 10,867,905 B2
(45) Date of Patent: Dec. 15, 2020

(54) INTERCONNECT STRUCTURES AND METHODS OF FORMING THE SAME

(71) Applicant: Taiwan Semiconductor Manufacturing Company, Ltd., Hsinchu (TW)

(72) Inventors: Sung-Li Wang, Zhubei (TW); Yasutoshi Okuno, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/993,726

(22) Filed: May 31, 2018

(65) Prior Publication Data

US 2019/0164887 A1 May 30, 2019

Related U.S. Application Data

(60) Provisional application No. 62/592,646, filed on Nov. 30, 2017.

(51) Int. Cl.
*H01L 23/522* (2006.01)
*H01L 23/528* (2006.01)
(Continued)

(52) U.S. Cl.
CPC .... *H01L 23/5226* (2013.01); *H01L 21/76802* (2013.01); *H01L 21/76832* (2013.01);
(Continued)

(58) Field of Classification Search
CPC ......... H01L 21/76831; H01L 21/76879; H01L 29/66553
See application file for complete search history.

(56) References Cited

U.S. PATENT DOCUMENTS 5,654,233 A     8/1997  Yu
6,245,655 B1 *  6/2001  Moslehi ............ H01L 21/76879
                                                    257/E21.586
(Continued)

FOREIGN PATENT DOCUMENTS

CN     107046012 A    8/2017
KR   20030068478 A    8/2003
(Continued)

OTHER PUBLICATIONS

A. Buekens et al., "Thermodynamic Behavior of Metal Chlorides and Sulfates under the Conditions of Incineration Furnaces," Environmental Science and Technology, vol. 30, No. 1, 1996, pp. 50-56.
(Continued)

*Primary Examiner* — Stephen M Bradley
(74) *Attorney, Agent, or Firm* — Slater Matsil, LLP

(57) ABSTRACT

Embodiments described herein relate generally to one or more methods for forming an interconnect structure, such as a dual damascene interconnect structure comprising a conductive line and a conductive via, and structures formed thereby. In some embodiments, an interconnect opening is formed through one or more dielectric layers over a semiconductor substrate. The interconnect opening has a via opening and a trench over the via opening. A conductive via is formed in the via opening. A nucleation enhancement treatment is performed on one or more exposed dielectric surfaces of the trench. A conductive line is formed in the trench on the one or more exposed dielectric surfaces of the trench and on the conductive via.

20 Claims, 16 Drawing Sheets

(51) Int. Cl.
*H01L 21/768* (2006.01)
*H01L 23/532* (2006.01)

(52) U.S. Cl.
CPC .. *H01L 21/76871* (2013.01); *H01L 21/76879* (2013.01); *H01L 23/5283* (2013.01); *H01L 23/5329* (2013.01); *H01L 23/53209* (2013.01); *H01L 23/53238* (2013.01); *H01L 23/53252* (2013.01); *H01L 23/53266* (2013.01); *H01L 23/53295* (2013.01)

(56) References Cited

U.S. PATENT DOCUMENTS

| | | | |
|---|---|---|---|
| 7,902,064 B1* | 3/2011 | Chiang | C23C 16/0272 |
| | | | 257/751 |
| 8,679,972 B1* | 3/2014 | Rozbicki | H01L 21/76805 |
| | | | 438/662 |
| 9,536,780 B1* | 1/2017 | Yang | H01L 21/76834 |
| 9,659,813 B1 | 5/2017 | Chang et al. | |
| 2002/0029958 A1* | 3/2002 | Chiang | C23C 14/046 |
| | | | 204/192.1 |
| 2003/0155657 A1 | 8/2003 | Tonegawa et al. | |
| 2003/0186524 A1 | 10/2003 | Ryo | |
| 2003/0203615 A1 | 10/2003 | Denning et al. | |
| 2004/0018722 A1 | 1/2004 | Tarumi et al. | |
| 2007/0077755 A1* | 4/2007 | Hong | H01L 21/76877 |
| | | | 438/627 |
| 2007/0298607 A1 | 12/2007 | Andryushchenko et al. | |
| 2008/0124926 A1* | 5/2008 | Chan | C23C 16/0281 |
| | | | 438/685 |
| 2009/0023286 A1 | 1/2009 | Yang et al. | |
| 2010/0227473 A1* | 9/2010 | Matsuda | H01L 21/02063 |
| | | | 438/653 |
| 2011/0237076 A1 | 9/2011 | Narushima | |
| 2012/0070982 A1 | 3/2012 | Yu et al. | |
| 2013/0200525 A1 | 8/2013 | Lee et al. | |
| 2014/0264872 A1 | 9/2014 | Lin et al. | |
| 2015/0024592 A1 | 1/2015 | Chandrashekar et al. | |
| 2015/0255330 A1 | 9/2015 | Lee | |
| 2015/0270215 A1* | 9/2015 | Peng | H01L 23/5226 |
| | | | 257/751 |
| 2015/0348840 A1 | 12/2015 | Bamnolker et al. | |
| 2015/0380302 A1* | 12/2015 | Mountsier | H01L 21/76831 |
| | | | 438/654 |
| 2016/0276214 A1 | 9/2016 | Fu et al. | |
| 2017/0194247 A1 | 7/2017 | Chang et al. | |
| 2018/0166333 A1* | 6/2018 | Yang | H01L 21/76843 |
| 2018/0350913 A1* | 12/2018 | Yang | H01L 23/53209 |

FOREIGN PATENT DOCUMENTS

| | | |
|---|---|---|
| KR | 100640407 B1 | 10/2006 |
| KR | 20130089544 A | 8/2013 |
| TW | 201436004 A | 9/2014 |
| TW | 201735251 A | 10/2017 |

OTHER PUBLICATIONS

Yang, et al. "Vaporization Characteristics of Heavy Metal Compounds at Elevated Temperatures," Korean J. of Chem. Eng., vol. 11 No. 4, 1994, pp. 232-238.

S. Norasetthekul et al., "Dry Etch Chemistries for TiO2 thin Films," Applied Surface Science, vol. 185, 2001, pp. 27-33.

* cited by examiner

INTERCONNECT STRUCTURES AND METHODS OF FORMING THE SAME

PRIORITY CLAIM AND CROSS-REFERENCE

This application claims the benefit of and priority to U.S. Provisional Patent Application Ser. No. 62/592,646, filed on Nov. 30, 2017, entitled "Interconnect Structures and Methods of Forming the Same," which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
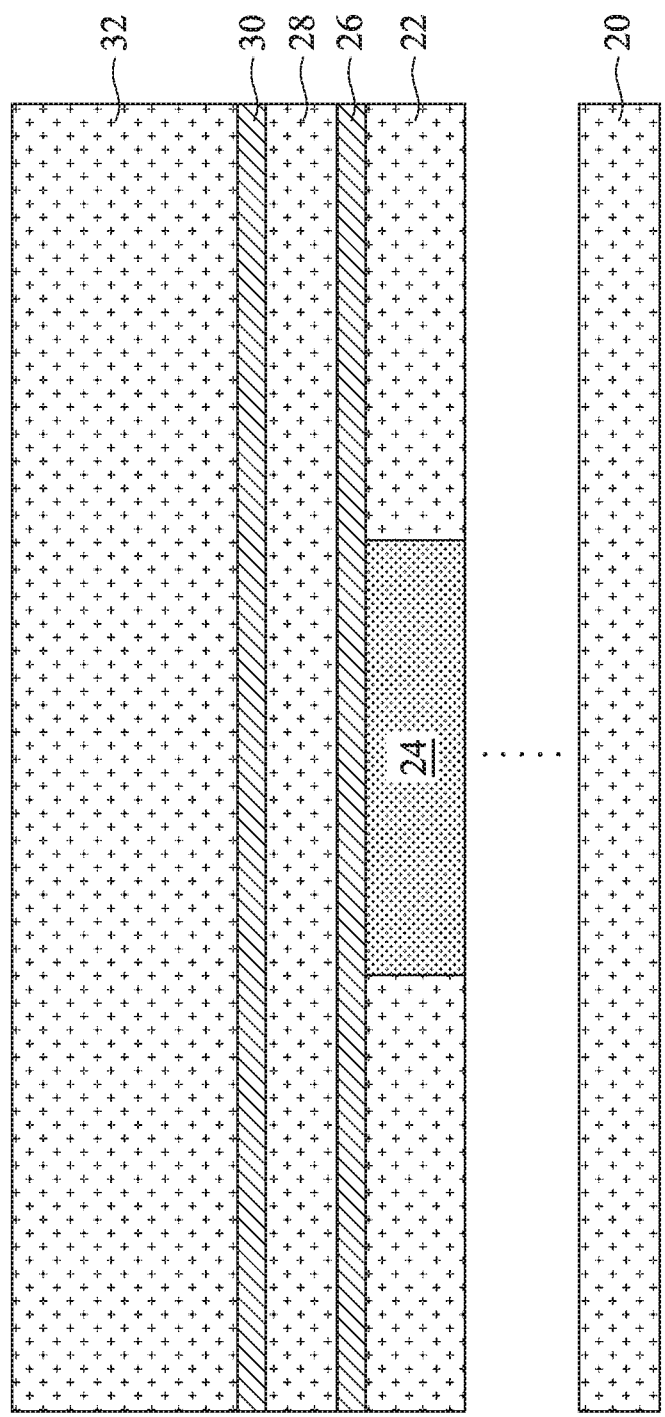
FIGS. 1 through 10 are cross-sectional views of respective intermediate structures during an example method for forming an interconnect structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate generally to one or more methods for forming an interconnect structure, such as a dual damascene interconnect structure comprising a conductive line and a conductive via, in semiconductor processing. Generally, a conductive via may be selectively deposited in a via opening for the interconnect structure, a nucleation enhancement treatment may then be performed, and a conductive fill material may subsequently be deposited in a trench for the interconnect structure. The nucleation enhancement treatment can cause the deposition of the conductive fill material to be bottom-up and/or conformal, such as by nucleating and being deposited on dielectric surfaces. Some embodiments can obviate using a seed layer for depositing the conductive fill material, and can further obviate using a high resistance metal-containing barrier layer in the interconnect structure. Hence, some process windows for forming the interconnect structure can be increased, and a resistance of the interconnect structure can be decreased. Other advantages or benefits may also be achieved.

Some embodiments described herein are in the context of Back End Of the Line (BEOL) processing. Other processes and structures within the scope of other embodiments may be performed in other contexts, such as in Middle End Of the Line (MEOL) processing and other contexts. Various modifications are discussed with respect to disclosed embodiments; however, other modifications may be made to disclosed embodiments while remaining within the scope of the subject matter. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1 through 10 illustrate cross-sectional views of respective intermediate structures during an example method for forming an interconnect structure in accordance with some embodiments. FIG. 11 is a flow chart of the example method 200 for forming the interconnect structure in accordance with some embodiments.

FIG. 1 and operation 202 of the method 200 illustrate the formation of dielectric layers over a semiconductor substrate 20. FIG. 1 illustrates a first dielectric layer 22 over the semiconductor substrate 20. The semiconductor substrate 20 may be or include a bulk semiconductor, a semiconductor-on-insulator (SOI) substrate, or the like, which may be doped (e.g., with a p-type or an n-type dopant) or undoped. In some embodiments, the semiconductor material of the semiconductor substrate 20 may include elemental semiconductor like silicon (Si) and germanium (Ge); a compound semiconductor; an alloy semiconductor; or a combination thereof.

Various devices may be on the semiconductor substrate 20. For example, the semiconductor substrate 20 may include Field Effect Transistors (FETs), such as Fin FETs (FinFETs), planar FETs, vertical gate all around FETs (VGAA FETs), or the like; diodes; capacitors; inductors; and other devices. Devices may be formed wholly within the semiconductor substrate 20, in a portion of the semiconductor substrate 20 and a portion of one or more overlying layers, and/or wholly in one or more overlying layers, for example. Processing described herein may be used to form and/or to interconnect the devices to form an integrated circuit. The integrated circuit can be any circuit, such as for an Application Specific Integrated Circuit (ASIC), a processor, memory, or other circuit.

The first dielectric layer 22 is above the semiconductor substrate 20. The first dielectric layer 22 may be directly on the semiconductor substrate 20, or any number of other layers may be disposed between the first dielectric layer 22 and the semiconductor substrate 20. For example, the first dielectric layer 22 may be or include an Inter-Metal Dielectric (IMD) or an Inter-Layer Dielectric (ILD). The first dielectric layer 22, for example, may be or comprise a low-k dielectric having a k-value less than about 4.0, such as about 2.0 or even less. In some examples, the first dielectric layer 22 comprises silicon oxide, phosphosilicate glass (PSG), borophosphosilicate glass (BPSG), fluorosilicate glass (FSG), $SiO_xC_y$, silicon carbon material, a compound thereof, a composite thereof, or a combination thereof.

A conductive feature 24 is in and/or through the first dielectric layer 22. The conductive feature 24 may be or include a conductive line and/or a conductive via, a gate structure of a transistor, or a contact plug to a gate structure of a transistor and/or to a source/drain region of a transistor. In some examples, the first dielectric layer 22 is an IMD, and the conductive feature 24 may include a conductive line and/or a conductive via (collectively or individually, "interconnect structure"). The interconnect structure may be formed by forming an opening and/or recess through and/or in the IMD, for example, using a damascene process. Some examples of forming an interconnect structure are described further below, although other processes and interconnect structures may be implemented. In other examples, the first dielectric layer 22 may include an ILD, and the conductive feature 24 may include a gate electrode (e.g., tungsten, cobalt, etc.) in the ILD formed using a replacement gate process, for example. In another example, the first dielectric layer 22 may be an ILD, and the conductive feature 24 may include a contact plug. The contact plug may be formed by forming an opening through the ILD to, for example, a gate electrode and/or source/drain region of a transistor formed on the semiconductor substrate 20. The contact plug can include an adhesion layer (e.g., Ti, etc.), a barrier layer (e.g., TiN, etc.) on the adhesion layer, and a conductive fill material (e.g., tungsten, cobalt, etc.) on the barrier layer. The contact plug can also be made of a less diffusive metal like tungsten, Mo, or Ru without a barrier layer.

A first etch stop layer (ESL) 26 is over the first dielectric layer 22 and the conductive feature 24. Generally, an ESL can provide a mechanism to stop an etch process when forming, e.g., contacts or conductive vias. An ESL may be formed of a dielectric material having a different etch selectivity from adjacent layers or components. The first ESL 26 is deposited on the top surfaces of the first dielectric layer 22 and the conductive feature 24. The first ESL 26 may comprise or be silicon nitride, silicon carbon nitride, silicon carbon oxide, carbon nitride, the like, or a combination thereof, and may be deposited by Chemical Vapor Deposition (CVD), Plasma Enhanced CVD (PECVD), Atomic Layer Deposition (ALD), or another deposition technique. A thickness of the first ESL 26, in some examples, is in a range from about 3 nm to about 10 nm.

A second dielectric layer 28 is over the first ESL 26. For example, the second dielectric layer 28 may be or include an IMD. The second dielectric layer 28 is deposited on the top surface of the first ESL 26. The second dielectric layer 28, for example, may be or comprise a low-k dielectric having a k-value less than about 4.0, such as about 2.0 or even less. In some examples, the second dielectric layer 28 comprises silicon oxide, PSG, BPSG, FSG, $SiO_xC_y$, silicon carbon material, a compound thereof, a composite thereof, or a combination thereof. The second dielectric layer 28 may be deposited using a CVD, such as PECVD or Flowable CVD (FCVD); spin-on coating; or another deposition technique. In some examples, a Chemical Mechanical Planarization (CMP) or another planarization process may be performed to planarize the top surface of second dielectric layer 28. A thickness of the second dielectric layer 28, in some examples, is in a range from about 4 nm to about 30 nm.

A second ESL 30 is over the second dielectric layer 28. The second ESL 30 is deposited on a top surface of the second dielectric layer 28. The second ESL 30 may comprise or be silicon nitride, silicon carbon nitride, silicon carbon oxide, carbon nitride, the like, or a combination thereof, and may be deposited by CVD, PECVD, ALD, or another deposition technique. A thickness of the second ESL 30, in some examples, is in a range from about 3 nm to about 10 nm.

A third dielectric layer 32 is over the second ESL 30. For example, the third dielectric layer 32 may be or include an IMD. The third dielectric layer 32 is deposited on the top surface of the second ESL 30. The third dielectric layer 32, for example, may be or comprise a low-k dielectric having a k-value less than about 4.0, such as about 2.0 or even less. In some examples, the third dielectric layer 32 comprises silicon oxide, PSG, BPSG, FSG, $SiO_xC_y$, silicon carbon material, a compound thereof, a composite thereof, or a combination thereof. The third dielectric layer 32 may be deposited using a CVD, such as PECVD or FCVD; spin-on coating; or another deposition technique. In some examples, a CMP or another planarization process may be performed to planarize the top surface of third dielectric layer 32. A thickness of the third dielectric layer 32, in some examples, is in a range from about 20 nm to about 50 nm, such as about 45 nm.

Figure 19:
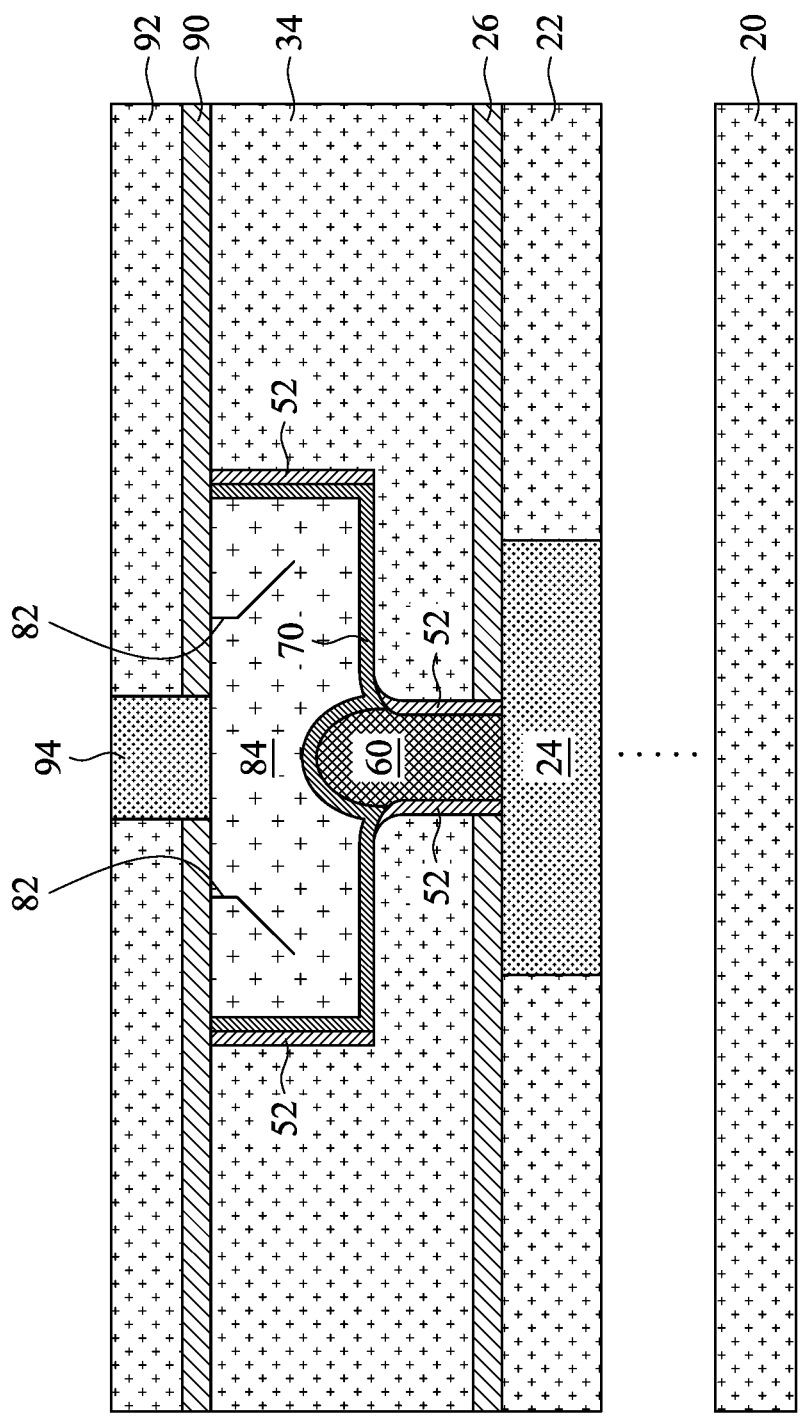
FIG. 19 is a cross-sectional view of an interconnect structure in accordance with some embodiments.

The configuration of the second dielectric layer 28, second ESL 30, and third dielectric layer 32 of FIG. 1 is an example. In other examples, the second ESL 30 may be omitted between the second dielectric layer 28 and the third dielectric layer 32. Further, in some examples, a single dielectric layer 34 (see FIG. 19) may be formed in the place of the second dielectric layer 28, second ESL 30, and third dielectric layer 32. A person having ordinary skill in the art will readily understand these and other modifications that may be made.

Figure 2:
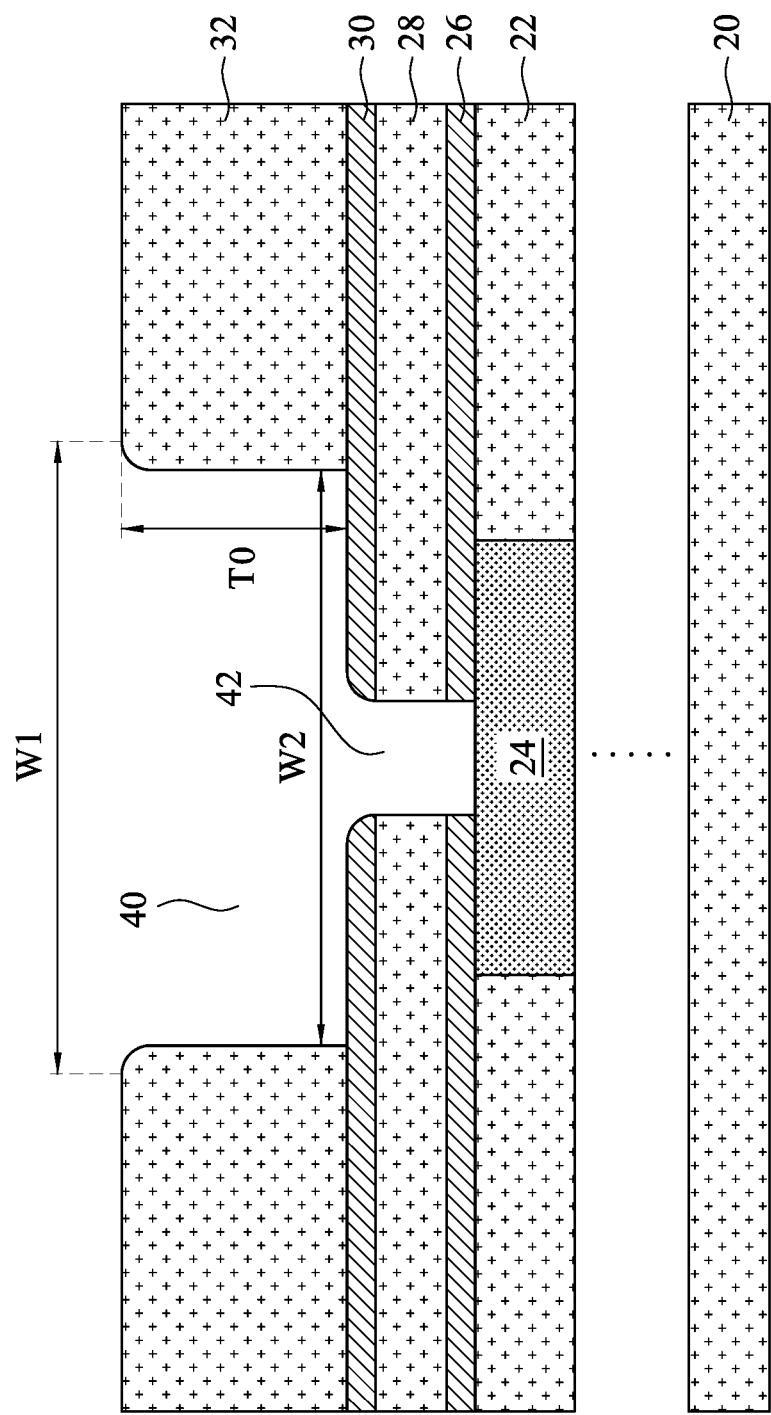

FIG. 2 and operation 204 of the method 200 illustrate the formation of a via opening 42 and a trench 40 in and/or through the first ESL 26, second dielectric layer 28, second ESL 30, and third dielectric layer 32. The via opening 42 and trench 40 can be formed using photolithography and etch processes, such as in a dual damascene process. For example, a photo resist can be formed on the third dielectric layer 32, such as by using spin-on coating, and patterned with a pattern corresponding to the trench 40 by exposing the photo resist to light using an appropriate photomask. Exposed or unexposed portions of the photo resist may then be removed depending on whether a positive or negative resist is used. The pattern of the photo resist may then be transferred to the third dielectric layer 32, such as by using a suitable etch process, which forms the trench 40 in the third dielectric layer 32. The etch process may include a reactive ion etch (RIE), neutral beam etch (NBE), inductive coupled plasma (ICP) etch, the like, or a combination thereof. The etch process may be anisotropic. The second ESL 30 may be used as an etch stop for the etch process. Subsequently, the photo resist is removed in an ashing or wet strip process, for example. Then, another photo resist can be formed on the third dielectric layer 32 and in the trench 40, such as by using spin-on coating, and patterned with a pattern corresponding to the via opening 42 by exposing the photo resist to light using an appropriate photomask. The pattern of the photo resist may then be transferred through the second ESL 30, second dielectric layer 28, and first ESL 26, such as by using one or more suitable etch process, which forms the via opening 42 through the second ESL 30, second dielectric layer 28, and first ESL 26. The etch process may include a RIE, NBE, ICP etch, the like, or a combination thereof. The etch process may be anisotropic. Subsequently, the photo resist is removed in an ashing or wet strip process, for example.

The sidewalls of the trench 40 and the via opening 42 are illustrated as being substantially vertical with rounding at corners. For example, linear portions of the sidewalls form an angle measured interior to the respective second dielectric layer 28 or third dielectric layer 32 that is in a range from about 85° to about 90°, such as about 85° to about 89°, and more particularly about 87°. In other examples, sidewalls of one or both of the trench 40 and the via opening 42 may be vertical or may taper together in a direction toward or away from the bottom of the via opening 42. For example, the via opening 42 may have a positive taper profile or a reentrant profile. Various examples of configurations for the via opening 42, and details thereof, are illustrated in and described with respect to FIGS. 13 through 18.

In the example configuration of FIG. 2, the trench 40 has a first width W1 in a plane of a top surface of the third dielectric layer 32 and has a second width W2 along a bottom surface of the trench 40. The first width W1, in some examples, is in a range from about 20 nm to about 40 nm, and the second width W2, in some examples, is in a range from about 18 nm to about 36 nm. The trench has a depth that is, in this example, equal to a first thickness T0 of the third dielectric layer 32. The first thickness T0, in some examples, is in a range from about 20 nm to about 50 nm, as stated previously. A first aspect ratio of the first thickness T0 to the first width W1 can be in a range from about 0.5 to about 2.5, and a second aspect ratio of the first thickness T0 to the second width W2 can be in a range from about 0.56 to about 2.78.

In an example configuration where the sidewalls of the trench are vertical, widths corresponding to the first width W1 and the second width W2 in FIG. 2 are equal, and each can be in a range from about 20 nm to about 40 nm. An aspect ratio of the first thickness To to the width of the trench 40, in this example, can be in a range from about 0.5 to about 2.5. In an example configuration where the sidewalls of the trench taper (e.g., a positive taper profile), the width corresponding to the first width W1 in FIG. 2 may be a function of the width ($W_{lower}$) corresponding to the second width W2 in FIG. 2 and the angle (θ) of the sidewall measured interior to the third dielectric layer 32 (e.g., $W_{upper}=W_{lower}+[2T_o(\tan\theta)^{-1}]$). The width corresponding to the second width W2 in FIG. 2 can be in a range from about 18 nm to about 36 nm, and the angle can be in a range from about 85° to about 89°, or may be less than 85°. An aspect ratio of the first thickness T0 to the width corresponding to the second width W2 of FIG. 2 can be in a range from about 0.56 to about 2.78.

A person having ordinary skill in the art will readily understand that the dimensions, ratios, and angles described herein are merely examples. Dimensions, ratios, and angles can vary based on technology generation nodes in which various aspects are implemented and/or based on various processes used. Such variations are within the scope of this disclosure.

Figure 3:
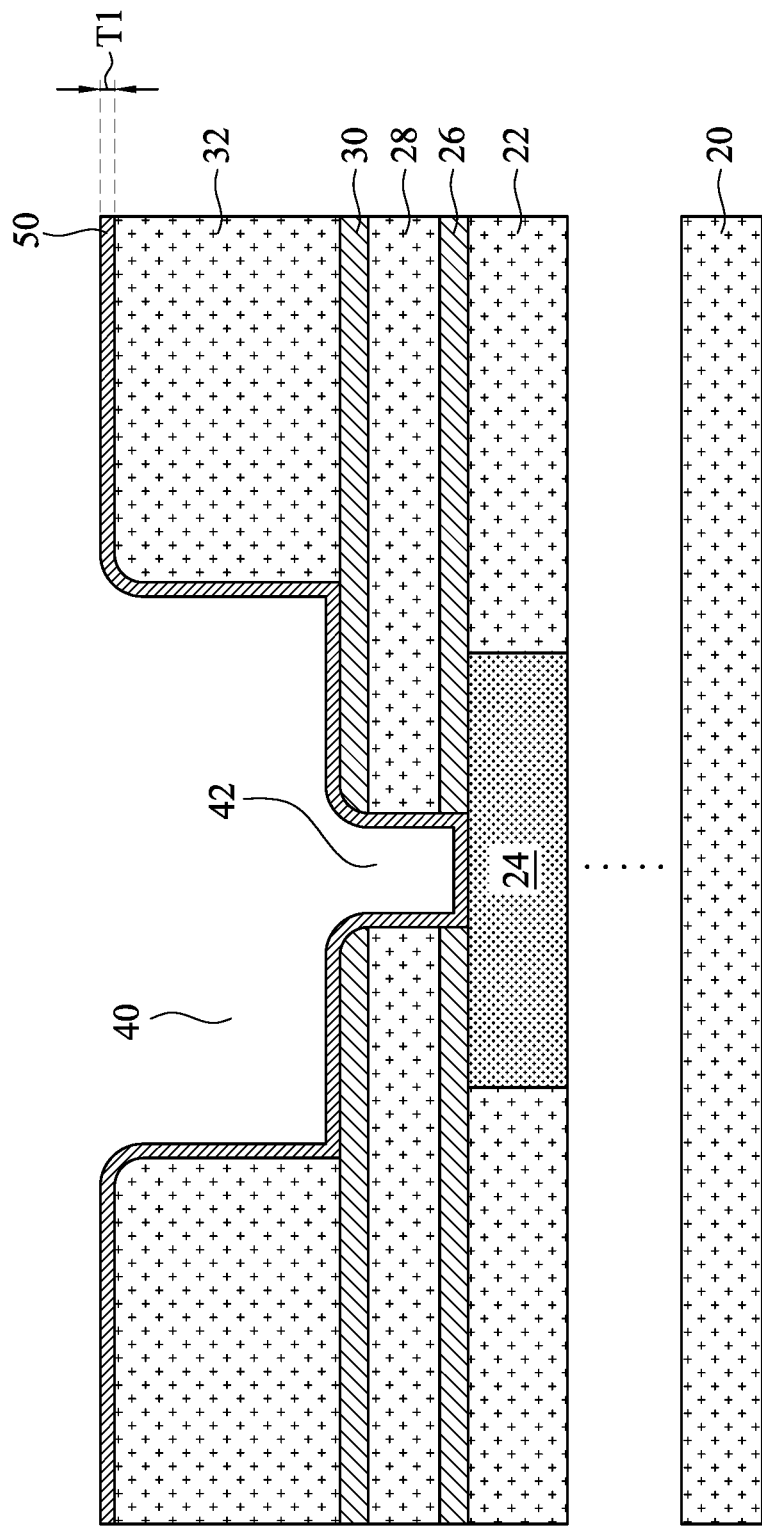

FIG. 3 and operation 206 of the method 200 illustrate the formation of a liner layer 50 conformally along sidewalls of the via opening 42 and the trench 40, along respective bottom surfaces of the via opening 42 and the trench 40, and along a top surface of the third dielectric layer 32. The liner layer 50 can be formed by conformal deposition. The liner layer 50 may be or comprise silicon nitride (SiN), silicon oxycarbide (SiOC), silicon carbon nitride (SiCN), silicon oxygen carbon nitride (SiOCN), a silicon-containing low-k dielectric, a carbon-containing low-k dielectric, the like, or a combination thereof, and may be deposited by CVD, ALD, or another deposition technique. A thickness of the liner layer 50, in some examples, is in a range from about 1 nm to about 4 nm, and more particularly, from about 2 nm to about 3 nm.

Figure 4:
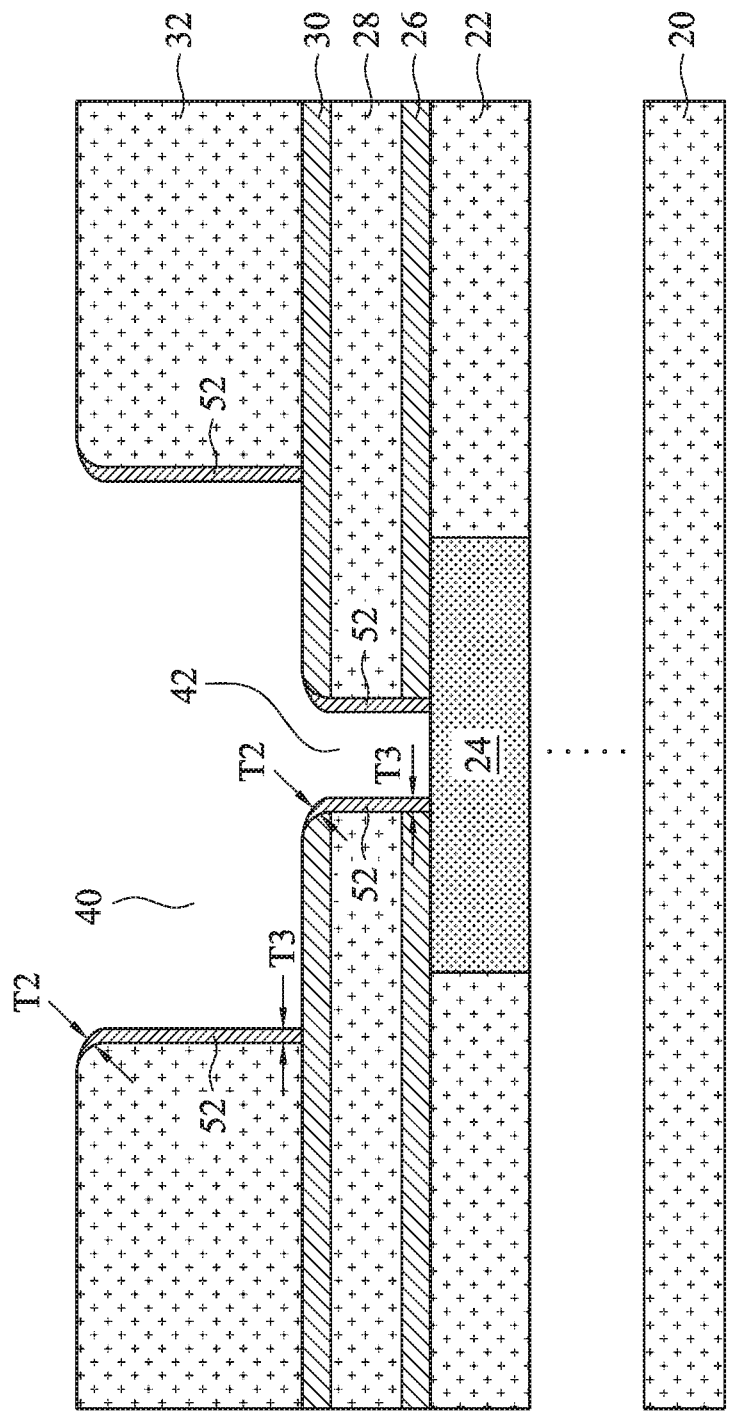

FIG. 4 and operation 208 of the method 200 illustrates the formation of respective liners 52 along sidewalls of the via opening 42 and along sidewalls of the trench 40 from the liner layer 50. The liners 52 can be formed by anisotropically etching the liner layer 50. The etch process for anisotropically etching the liner layer 50 may include a RIE, NBE, ICP etch, the like, or a combination thereof. The liners 52, and the second ESL 30, if implemented, may be diffusion barriers that can reduce or prevent out-diffusion of a conductive fill material subsequently deposited in the trench 40 and via opening 42 to, e.g., the second dielectric layer 28 and third dielectric layer 32. The liners 52 and second ESL 30 can form a dielectric diffusion barrier.

Profiles of the liners 52 can vary depending on, among other things, the profiles of the sidewalls of the trench 40 and via opening 42. In the example of FIG. 4, at rounded corners at the sidewalls where the slope of the corner is approximately 45°, a second thickness T2 can substantially equal the first thickness T1 of the liner layer 50 minus the thickness ($t_{etched}$) removed by the anisotropic etch in a vertical direction times the square root of two divided by two (e.g., $T_1-[t_{etched}\times 2^{-(1/2)}]$). Further, a third thickness T3 along a substantially vertical portion of a respective sidewall at the bottom of the trench 40 or via opening 42 can be equal to the first thickness T1 of the liner layer 50. In some examples, the second thickness T2 is in a range from about 0.3 nm to about 1.2 nm, and the third thickness T3 is in a range from about 1 nm to about 4 nm. A person having ordinary skill in the art will readily understand the relationship that the thicknesses of the liners 52 can have with the underlying slope angles of the sidewalls.

In an example configuration where the sidewalls of the trench are vertical, thicknesses corresponding to the second thickness T2 and the third thickness T3 in FIG. 4 are equal (which may further be substantially equal to the first thickness T1 of the liner layer 500), and each can be in a range from about 1 nm to about 4 nm. In an example configuration where the sidewalls of the trench taper (e.g., a positive taper profile) at a constant slope angle, the thicknesses corresponding to the second thickness T2 and the third thickness T3 in FIG. 4 are equal. The thicknesses can be a function of the first thickness T1 of the liner layer 50 and the angle of the sidewall similar to described above as a person having ordinary skill in the art would understand. The width corresponding to the second width W2 in FIG. 2 can be in a range from about 1 nm to about 4 nm.

Profiles of the liners 52 can further vary depending on step coverage of the deposition process used to deposit the liner layer 50. For example, a thickness of the liner 52 along sidewalls of the via opening 42 can vary from a thickness of the liner 52 along sidewalls of the trench 40 due to step coverage variation.

In operation 210 of the method 200, after forming the liners 52, optionally, a cleaning process may be performed to clean exposed surfaces of, e.g., the trench 40 and via opening 42. The cleaning process can include a plasma treatment, an etch process, another cleaning process, or a combination thereof. In an example, the cleaning process includes a plasma treatment (operation 212) followed by an Atomic Layer Etch (ALE) (operation 214). The plasma treatment in operation 212 can include using a hydrogen ($H_2$) gas with a carrier gas, such as argon (Ar). The plasma treatment, in some instances, can reduce an oxide that may be formed on a surface of the conductive feature 24 exposed through the via opening 42 and can remove organic material that may be formed on various surfaces. A flow rate of the hydrogen gas in the plasma treatment can be in a range from about 5 sccm to about 1,000 sccm, and a flow rate of the carrier gas in the plasma treatment can be in a range from about 0 sccm to about 1,000 sccm. A pressure of the plasma treatment can be in a range from about 10 mTorr to about 200 mTorr. A temperature of the plasma treatment can be in a range from about $-20°$ C. to about $100°$ C. A power of the plasma generator of the plasma treatment can be in a range from about 20 W to about 400 W, and a frequency of the plasma generator can be about 13.56 MHz or greater. The substrate during the plasma treatment can be biased in a range from about 20 V to about 100 V. A duration of the plasma treatment can be in a range from about 5 seconds to about 120 seconds.

Figure 12:
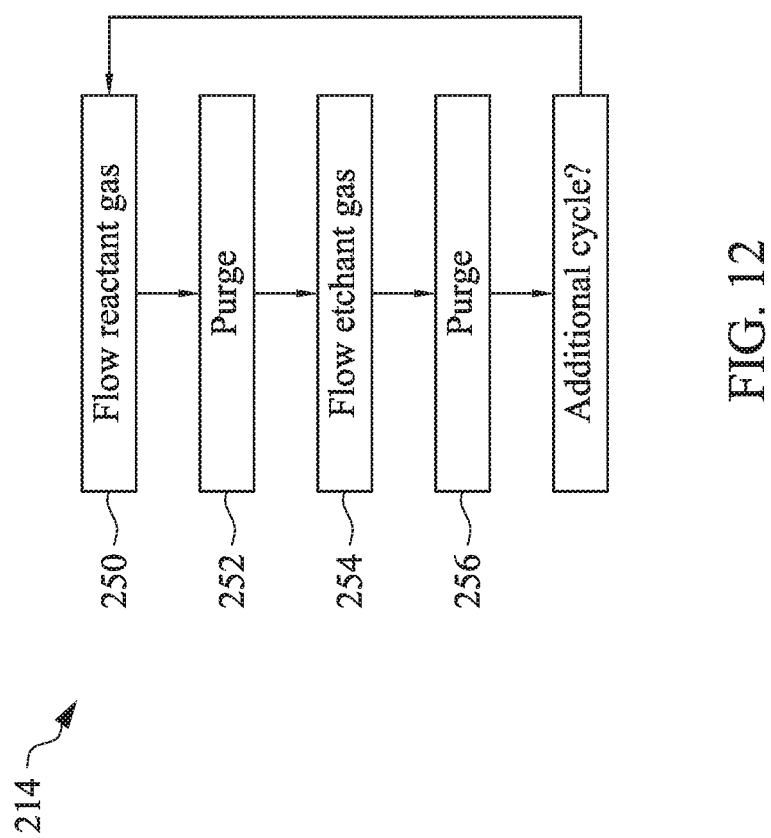
FIG. 12 is a flow chart of an example Atomic Layer Etch (ALE) process in accordance with some embodiments.

The ALE in operation 214 is illustrated in further detail in FIG. 12. The ALE in operation 214 can include performing multiple cycles, such as in a range from 2 cycles to 25 cycles. A cycle of the ALE can include sequentially flowing a reactant gas (operation 250), such as boron trichloride ($BCl_3$) gas, with a carrier gas (e.g., argon (Ar)); purging (operation 252) the reactant gas; flowing an etchant gas (operation 254), such as hydrogen ($H_2$) gas, with a carrier gas (e.g., argon (Ar)) and possibly with plasma enhancement; and purging (operation 256) the etchant gas. In some examples, the reactant gas, e.g., boron trichloride ($BCl_3$) gas, is adsorbed on dielectric surfaces to form a monolayer and is not significantly adsorbed on metal surfaces, and the monolayer is etched by the flowing of the etchant gas, e.g., hydrogen ($H_2$) gas. An example provided here implements boron trichloride ($BCl_3$) gas as the reactant gas and hydrogen ($H_2$) gas as the etchant gas; other gases may be used. During the flowing of the boron trichloride ($BCl_3$) gas, a flow rate of the boron trichloride ($BCl_3$) gas can be in a range from about 20 sccm to about 180 sccm, and a flow rate of the carrier gas can be in a range from about 200 sccm to about 800 sccm. Further, during the flowing of the boron trichloride ($BCl_3$) gas, a pressure of the ALE can be in a range from about 15 mTorr to about 100 mTorr, and a temperature of the ALE can be in a range from about $-20°$ C. to about $60°$ C. After the boron trichloride is purged, the hydrogen ($H_2$) gas begins to flow and a plasma is ignited. During the flowing of the hydrogen ($H_2$) gas, a flow rate of the hydrogen ($H_2$) gas can be in a range from about 5 sccm to about 1,000 sccm, and a flow rate of the carrier gas can be in a range from about 50 sccm to about 400 sccm. Further, during the flowing of the hydrogen ($H_2$) gas, a pressure of the ALE can be in a range from about 10 mTorr to about 200 mTorr, and a temperature of the ALE can be in a range from about $-20°$ C. to about $20°$ C. A power of the plasma generator of the ALE can be in a range from about 10 W to about 800 W, and a frequency of the plasma generator can be about 13.56 MHz or greater. The substrate during the plasma of the ALE can be biased in a range from about 50 V to about 300 V.

In operation 216 of the method 200, after the cleaning process in operation 210 is optionally performed, a selectivity enhancement treatment can optionally be performed on exposed dielectric surfaces of, e.g., the trench 40 and via opening 42. The selectivity enhancement treatment can, for example, treat and/or passivate dielectric surfaces so that a subsequent deposition of metal has a higher selectivity to deposit the metal at a greater rate on a metallic surface than the dielectric surfaces compared to without such treatment. For example, the selectivity enhancement treatment can cause the dielectric surfaces to be hydrophobic, which can improve selectivity during a subsequent deposition of metal. The selectivity enhancement treatment can include flowing a silicon-containing hydrocarbon gas over the dielectric surfaces. The selectivity enhancement treatment can be a tri-methylsiloxy (TMS) treatment, a di-methylsiloxy (DMS) treatment, the like, or a combination thereof. Example silicon-containing hydrocarbon gases include 1,1,1,3,3,3-hexamethyldisilazane (HDMS), chlorotrimethylsilane (TMCS), N, O-bis(trimethylsilyl)acetamide (BSA), N-(trimethylsilyl)dimethylamine (TMS-DMA), TMS-imidazole (SIM, N-trimethylsilylimidazole), 1,1,3,3-tetramethyldisilazane (TMDS), chlorodimethylsilane (DMCS), the like, or a combination thereof. The selectivity enhancement treatment can cause a silylation process in which an atom or group of atoms terminated at the dielectric surface can be substituted by a species of the silicon-containing hydrocarbon, which can cause the dielectric surface to be rendered hydrophobic. A flow rate of the silicon-containing hydrocarbon can be in a range from about 5 sccm to about 100 sccm, and a flow rate of a carrier gas flowed with the silicon-containing hydrocarbon can be in a range from about 0 sccm to about 400 sccm. A pressure during the flowing the silicon-containing hydrocarbon can be in a range from about 1 mTorr to about 100 mTorr, and a temperature can be in a range from about $20°$ C. to about $300°$ C. The selectivity enhancement treatment can treat or passivate the exposed dielectric surfaces of the liners 52, the second ESL 30, and the third dielectric layer 32 to improve selectivity of a subsequent selective deposition on the conductive feature 24.

Figure 5:
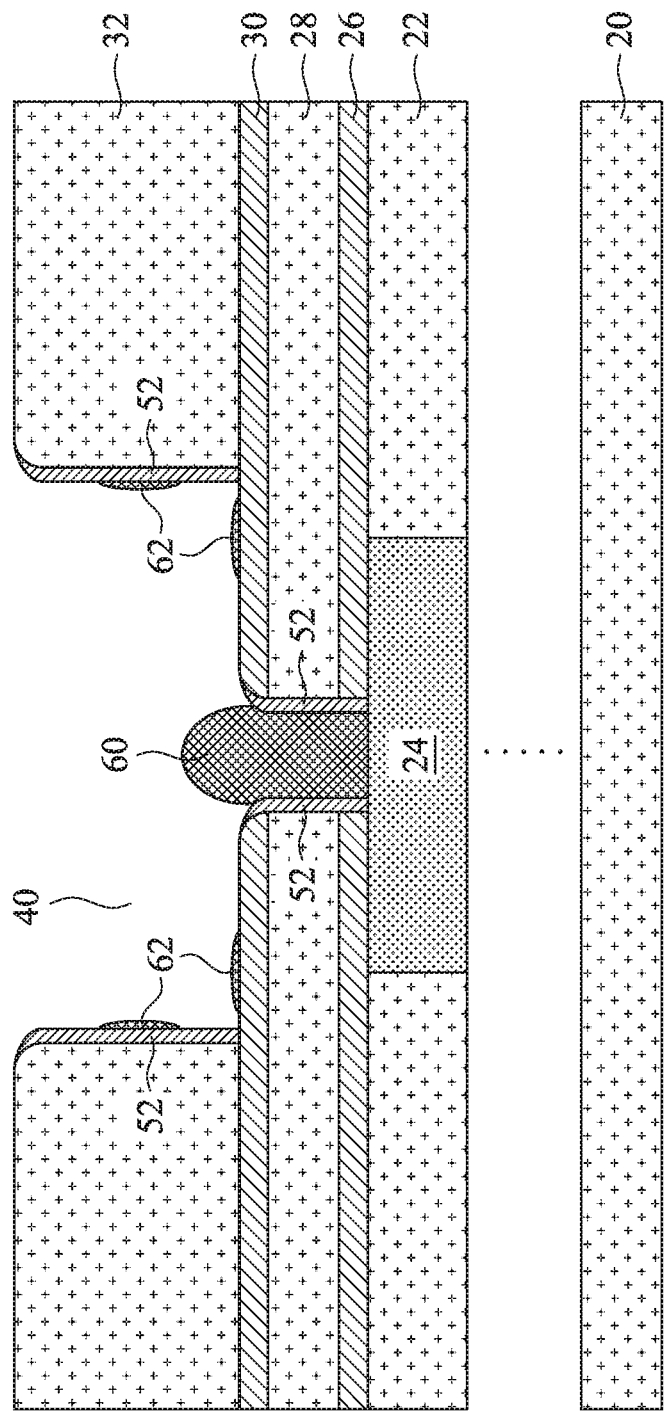

FIG. 5 and operation 218 of the method 200 illustrate the formation of a conductive via 60 in the via opening 42. The formation of the conductive via 60 can include a selective deposition. The selective deposition can use the conductive feature 24 exposed through the via opening 42 as a seed, for example. The selective deposition can include electroless deposition or plating, selective CVD, or another technique. The conductive via 60 can be or include a metal, such as cobalt (Co), ruthenium (Ru), the like, or a combination thereof. In an example, the conductive via 60 is cobalt deposited using electroless deposition or plating. The electroless deposition or plating of cobalt (Co) may be at a temperature in a range equal to or less than about 200° C., such as in a range from room temperature (e.g., about 23° C.) to about 200° C. The selective CVD can include using a precursor gas comprising $Ru_3(CO)_{12}$, $C_{10}H_{10}Ru$, $C_7H_9RuC_7H_9$, $Ru(C_5(CH_3)_5)_2$, the like, or a combination thereof, and a carrier gas, such as argon (Ar). A flow rate of the precursor gas can be in a range from about 5 sccm to about 100 sccm, and a flow rate of the carrier gas can be in a range from about 10 sccm to about 400 sccm. A pressure of the selective CVD can be in a range from about 0.2 mTorr to about 20 mTorr. A temperature of the selective CVD can be less than or equal to about 200° C., such as in a range from room temperature (e.g., about 23° C.) to about 200° C.

As illustrated in FIG. 5, an upper surface of the conductive via 60 is convex. In other examples, an upper surface of the conductive via 60 can be concave or planar. Various examples of configurations for the conductive via 60 formed in the via opening 42, and details thereof, are illustrated in and described with respect to FIGS. 13 through 18.

As illustrated in FIG. 5, some residual deposition sites 62 may be formed during the selective deposition used to form the conductive via 60. The residual deposition sites 62 may be formed on various surfaces, such as surfaces of the second ESL 30 and the liner 52 in the trench 40.

Figure 6:
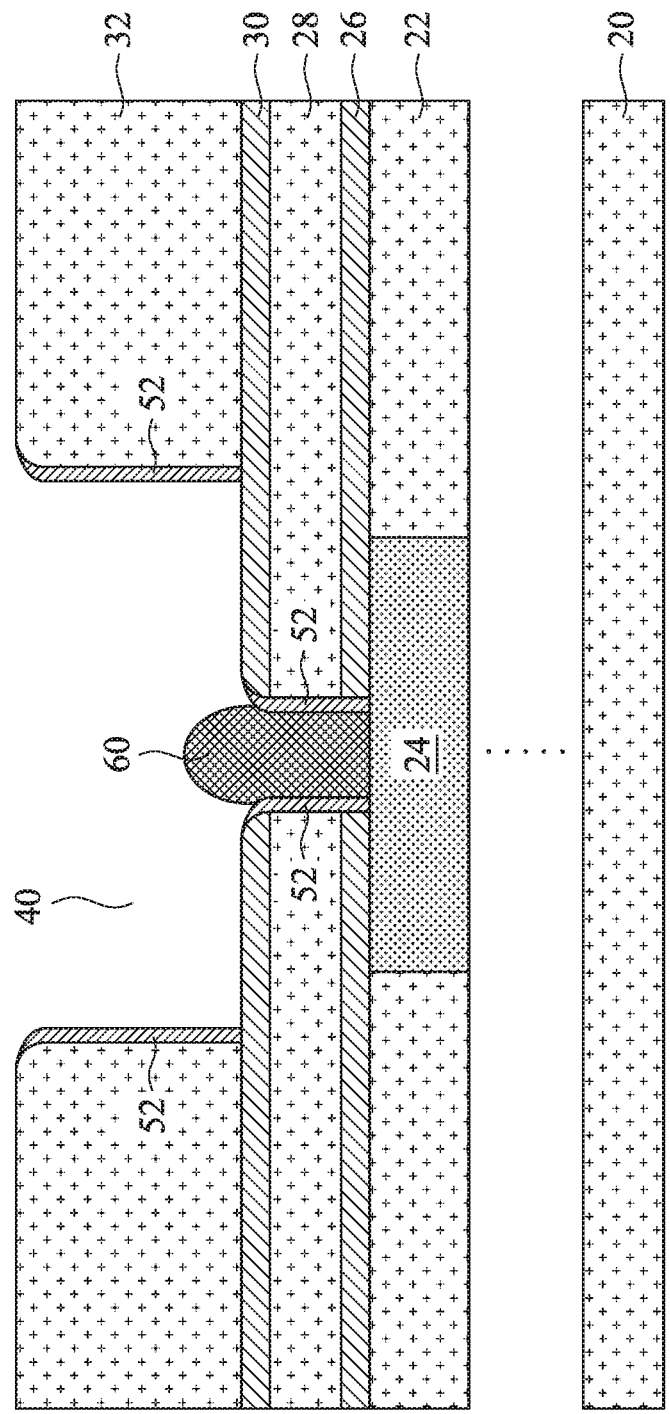

FIG. 6 and operation 220 of the method 200 illustrate the performance of a selective etch back that removes the residual deposition sites 62. The etch back can be a dry (e.g., plasma) etch process, a wet etch process, or a combination thereof. A plasma etch process can include using a fluorocarbon ($C_xF_y$) gas, a chlorofluorocarbon ($C_xCl_yF_z$) gas, a carbon chloride ($C_xCl_y$) gas, the like or a combination thereof. A wet etch process can include using one or more solutions of standard clean-1 (SC1), standard clean-2 (SC2), sulfuric acid-hydrogen peroxide mixture (SPM), diluted hydrofluoric (dHF) acid, hydrogen peroxide ($H_2O_2$), buffered oxide etch (BOE) solution, hydrochloric (HCl) acid, the like, or a combination thereof. A temperature of the solution can be in a range from about 20° C. to about 90° C., and a duration of immersion of the substrate in the solution can be in a range from about 10 seconds to about 120 seconds.

Figure 7:
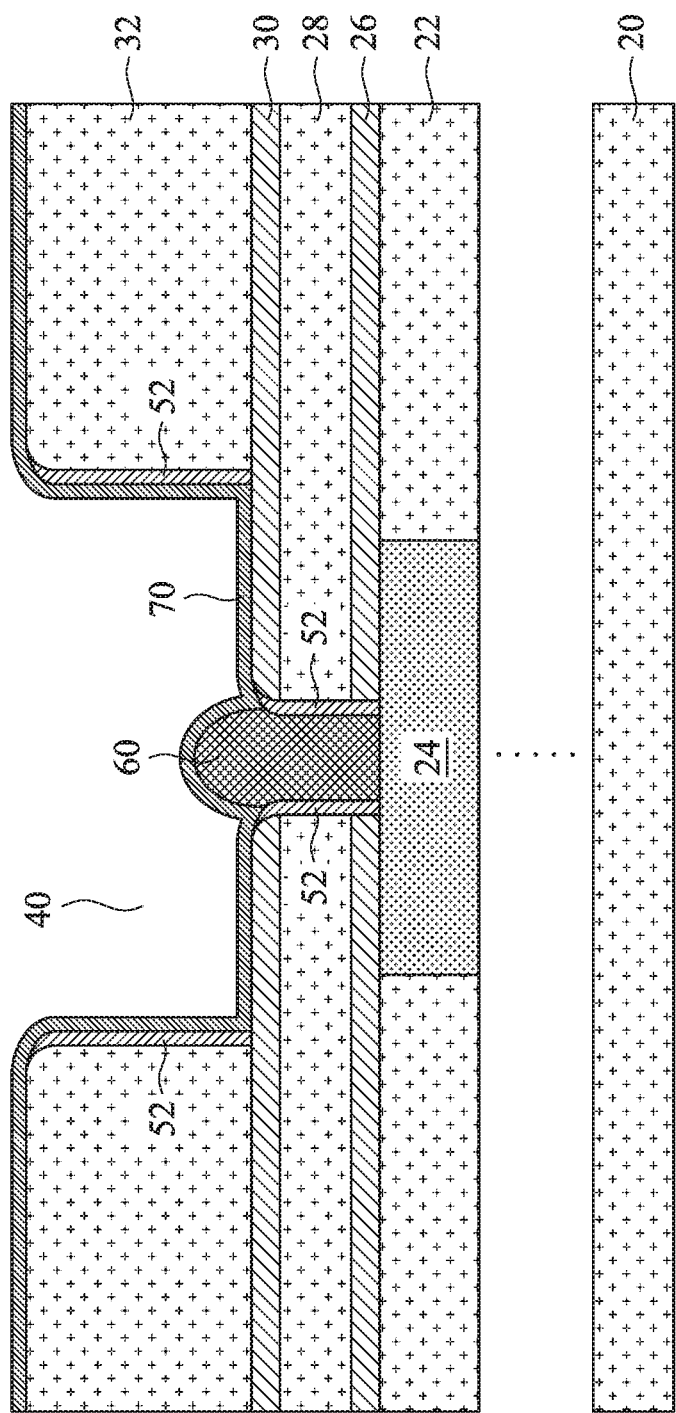

FIG. 7 and operation 222 of the method 200 illustrate the performance of a nucleation enhancement treatment along, e.g., exposed surfaces in the trench 40 including an upper surface of the conductive via 60, to form treated surfaces 70. Generally, the nucleation enhancement treatment breaks bonds along, e.g., exposed surfaces in the trench 40 to enhance the ability for adsorption of material in a subsequent deposition process. In some examples, the nucleation enhancement treatment includes sputtering (operation 224), implantation (operation 226), a plasma treatment (operation 228), an ultra-violet (UV) treatment (operation 230), plasma doping (operation 232), the like, or a combination thereof. The nucleation enhancement treatment can be directional (e.g., anisotropic) or conformal (e.g., isotropic). In some examples, the nucleation enhancement treatment can treat, e.g., vertical surfaces, albeit to a lesser extent than, e.g., horizontal surfaces. The extent to which the nucleation enhancement treatment is performed (e.g., the extent to which bonds are broken along surfaces) can affect a number of nucleation sites and, therefore, at least an initial deposition rate for a later deposited conductive fill material 80, as will be described subsequently. Generally, the more bonds that are broken and the more dangling bonds that are created, the more nucleation sites may be available for adsorption and nucleation of the conductive fill material 80 for an increased deposition rate, at least initially in the deposition.

In some examples, the nucleation enhancement treatment can be directional to treat substantially only horizontal surfaces (e.g., a top surface of the second ESL 30 and upper surface of the conductive via 60 exposed by the trench 40), which can enable bottom-up deposition of a conductive fill material in the trench 40 and reduce seams and voids being formed in the conductive fill material in the trench 40.

In an example, the nucleation enhancement treatment is sputtering (operation 224) using argon (Ar) gas. A flow rate of the argon gas can be in a range from about 10 sccm to about 2,000 sccm. A pressure of the sputtering can be in a range from about 0.5 mTorr to about 50 mTorr, and a temperature of the sputtering can be in a range from about −20° C. to about 120° C. A power of the plasma generator of the sputtering can be in a range from about 100 W to about 2,000 W, and a frequency of the plasma generator can be about 13.56 MHz or greater. The substrate can be biased during the sputtering in a range from about 50 V to about 300 V. The sputtering can be directional (e.g., treats horizontal surfaces), although in some examples, the sputtering can be conformal. The sputtering can cause argon to be deposited on the treated surfaces 70 and/or embedded in the respective materials to a depth below the treated surfaces 70. For example, the species used for the sputtering (e.g., argon) can be embedded into the materials that form the treated surface 70 (e.g., the conductive via 60, the second ESL 30, the liners 52 in the trench 40, and the third dielectric layer 32) to a depth of the respective materials from the treated surfaces 70 equal to or less than about 2 nm and at a concentration in a range from about $1 \times 10^{18}$ $cm^{-3}$ to about $1 \times 10^{19}$ $cm^{-3}$. The concentration of the species can decrease from a peak proximate to the respective treated surfaces 70 to a depth in the material. The sputtering can break bonds by the species colliding with atoms of the material that is exposed (e.g., the treated surfaces 70).

In another example, the nucleation enhancement treatment is a beam line implantation (operation 226). The species implemented for the beam line implantation can include silicon (Si), germanium (Ge), carbon (C), nitrogen (N), argon (Ar), the like, or a combination thereof. An implantation energy can be in a range from about 2 keV to about 10 keV. A dosage of the implantation can be in a range from about $10^{13}$ $cm^{-2}$ to about $2 \times 10^{15}$ $cm^{-2}$. The implantation can be to a depth from a respective exposed surface in a range from about 1 nm to about 4 nm and to a concentration of the implanted species in a range from about $5 \times 10^{18}$ $cm^{-3}$ to about $5 \times 10^{21}$ $cm^{-3}$. The concentration of the species can decrease from a peak proximate to the respective treated surfaces 70 to a depth in the material. The beam line implantation can be directional, although in some examples, multiple implantations may be performed to achieve a more conformal treatment. The beam line implantation can break bonds by the implanted species colliding with atoms of the material that is implanted (e.g., the treated surfaces 70).

In a further example, the nucleation enhancement treatment is a plasma treatment (operation 228). The plasma treatment can include using a gas comprising xenon (Xe), argon (Ar), hydrogen ($H_2$), nitrogen ($N_2$), the like or a combination thereof. A flow rate of the gas can be in a range from about 10 sccm to about 2,000 sccm. A pressure of the plasma treatment can be in a range from about 10 mTorr to about 100 mTorr, and a temperature of the plasma treatment can be in a range from about −20° C. to about 60° C. A power of the plasma generator of the plasma treatment can be in a range from about 20 W to about 200 W, and a frequency of the plasma generator can be about 13.56 MHz or greater. The substrate during the plasma treatment can be biased in a range from about 50 V to about 300 V. The species of the plasma can damage the exposed surfaces and can diffuse into the exposed surfaces. The plasma treatment can be conformal or directional. The plasma treatment can cause the species of the plasma to be embedded on the treated surfaces 70 and/or diffused in the respective materials to a depth below the treated surfaces 70. For example, the species used for the plasma (e.g., xenon, argon, hydrogen, etc.) can be diffused into the materials that form the treated surface 70 (e.g., the conductive via 60, the second ESL 30, the liners 52 in the trench 40, and the third dielectric layer 32) to a depth of the respective materials from the treated surface 70 equal to or less than about 5 nm and at a concentration in a range from about $1\times10^{18}$ cm$^{-3}$ to about $1\times10^{20}$ cm$^{-3}$. The concentration of the species can decrease from a peak proximate to the respective treated surfaces 70 to a depth in the material.

In a yet further example, the nucleation enhancement treatment is a UV treatment (operation 230). The UV treatment can include exposing the substrate to UV light in an ambient. The ambient can include a gas comprising argon (Ar), neon (Ne), xenon (Xe), the like, or a combination thereof. An energy of the UV light exposure can be in a range from about 3.4 eV to about 10 eV. A duration of the UV light exposure can be equal to or less than about 300 seconds, such as in a range from about 15 seconds to about 300 seconds. The UV treatment can cause bonds on the exposed surfaces to break thereby damaging the exposed surfaces. The species of the ambient during the UV treatment can diffuse into the exposed surfaces. For example, the species of the ambient (e.g., xenon, argon, neon, etc.) can diffuse into the materials that form the treated surface 70 (e.g., the conductive via 60, the second ESL 30, the liners 52 in the trench 40, and the third dielectric layer 32) to a depth of the respective materials from the treated surface 70 equal to or less than about 5 nm. A concentration of the species can decrease from a peak proximate to the respective treated surfaces 70 to a depth in the material. The UV treatment can be directional, although in some examples, multiple UV treatment may be performed to achieve a more conformal treatment.

In an even further example, the nucleation enhancement treatment is plasma doping (operation 232). The species implemented for the plasma doping can include boron (B), argon (Ar), the like, or a combination thereof. The doping can be to a depth from a respective exposed surface in a range from about 1 nm to about 5 nm and to a concentration in a range from about $1\times10^{19}$ cm$^{-3}$ to about $1\times10^{20}$ cm$^{-3}$. The concentration of the species can decrease from a peak proximate to the respective treated surfaces 70 to a depth in the material. The plasma doping can break bonds by the implanted species colliding with atoms of the material that is implanted (e.g., the treated surfaces 70).

Figure 8:
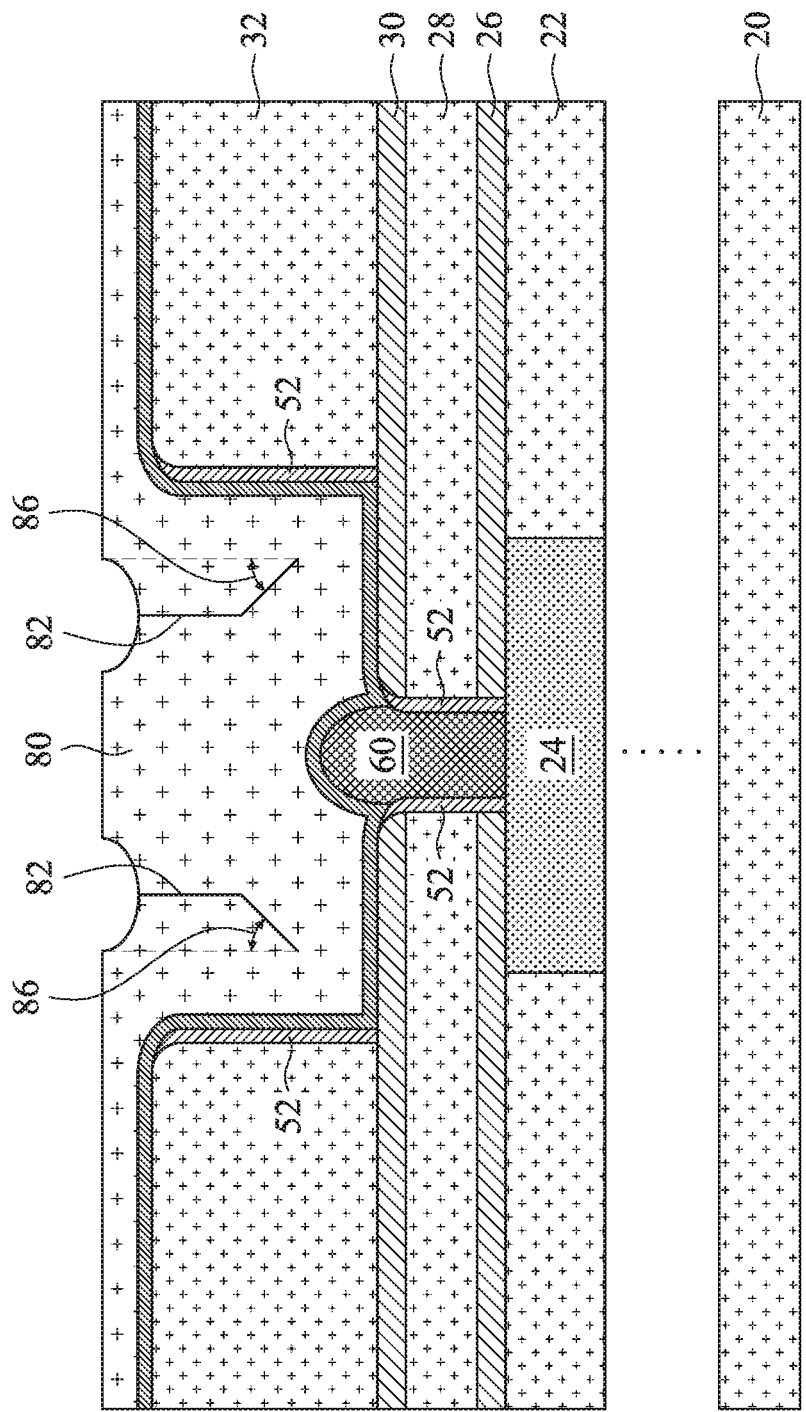

FIG. 8 and operation 234 of the method 200 illustrates the formation of a conductive fill material 80 on the treated surfaces 70, e.g., filling the trench 40. The formation of the conductive fill material 80 may be by a deposition process that deposits the conductive fill material 80 on dielectric surfaces as well as metallic surfaces. The nucleation enhancement treatment described with respect to FIG. 7 can create nucleation sites on dielectric surfaces (e.g., on the treated surfaces 70) on which the conductive fill material 80 can be adsorbed during deposition. Hence, the deposition of the conductive fill material 80 can be a bottom-up deposition and/or a conformal deposition, such as depending on the directionality of the nucleation enhancement treatment. In a bottom-up deposition, seams can be avoided by having a single growth front of the conductive fill material 80 that propagates vertically in the trench 40.

As a result of a conformal deposition, seams 82 can be formed in the conductive fill material 80 in the trench 40. The seams 82 can result from the merging or coalescing of different growth fronts of the conductive fill material 80 during the conformal deposition. For example, a growth front originating from a sidewall surface of the liner 52 along a sidewall of the third dielectric layer 32 can coalesce or merge with a growth front originating from a top surface of the second ESL 30 to form at least a portion of a seam 82. The seams 82 may each include, for example, one or more voids, grain boundaries of the conductive fill material 80, and/or other indications of the coalescing or merging of growth fronts. A seam 82 can have an angle 86 with respect to a vertical direction (e.g., perpendicular to the top surface of the second ESL 30). The angle 86 can be in a range from about 25° to about 75°, and more particularly, from about 30° to about 60°. The angle 86 can be affected by the proximity of the sidewall surface of the liner 52 to the conductive via 60. In some examples, the growth rate of the conductive fill material 80 is greater from the conductive via 60 than from dielectric surfaces, such as the sidewall of the liner 52, such as by about two to about three times. Hence, in such examples, the closer the sidewall of the liner 52 is to the conductive via 60, the smaller the angle 86 may be.

In some examples, the deposition of the conductive fill material 80 includes using a CVD, an electroless plating or deposition, or another deposition process. The conductive fill material 80 can be or include a metal, such as ruthenium (Ru), nickel (Ni), molybdenum (Mo), cobalt (Co), tungsten (W), copper (Cu), the like, or a combination thereof. In some examples, the conductive fill material 80 is or includes ruthenium (Ru), molybdenum (Mo), cobalt (Co), or tungsten (W) deposited by CVD. Example precursors for ruthenium include triruthenium dodecacarbonyl ($Ru_3(CO)_{12}$), CHORUS, the like, or a combination thereof. Example precursors for molybdenum include molybdenum(V) chloride ($MoCl_5$), $Mo(CO)_5$, the like, or a combination thereof. Example precursors for cobalt include dicobalt hexacarbonyl tert-butylacetylene (CCTBA), the like, or a combination thereof. Example precursors for tungsten include tungsten hexafluoride ($WF_6$), tungsten(V) chloride ($WCl_5$), the like, or a combination thereof. A flow rate of the precursor gas during the CVD can be in a range from about 10 sccm to about 200 sccm, and a flow rate of a carrier gas (e.g., argon (Ar)) can be in a range from about 100 sccm to about 800 sccm. A pressure of the CVD can be in a range from about 0.2 mTorr to about 20 mTorr. A temperature of the CVD can be less than or equal to about 175° C., such as in a range from 120° C. to 170° C. (particularly for ruthenium deposition, for example). In other examples, nickel can be deposited using electroless plating or deposition. An anneal or reflow may be performed after the conductive fill material 80 is deposited.

In some examples, a silicide and/or a carbide can be formed along the treated surfaces 70 of dielectric material that includes silicon and/or carbon, respectively. For example, assuming that the liner 52 and second ESL 30 include silicon, the nucleation enhancement treatment can cause the silicon to have a dangling bond at the treated surfaces 70, and a metal of the conductive fill material 80 can attach to the dangling bond and/or react with the silicon of the treated surfaces 70 to form a silicide at an interface between the conductive fill material 80 and the liner 52 or second ESL 30. The metal of the conductive fill material 80 can attach to the dangling bond and/or react with the silicon of the treated surfaces 70 during the deposition of the conductive fill material 80 (e.g., when a precursor is flowed on the treated surfaces 70) and/or subsequent to the deposition of the conductive fill material 80. Similarly, for example, assuming that the liner 52 and second ESL 30 include carbon, the nucleation enhancement treatment can cause the carbon to have a dangling bond at the treated surfaces 70, and a metal of the conductive fill material 80 can attach to the dangling bond and/or react with the carbon of the treated surfaces 70 to form a carbide (e.g., a metal carbide) at an interface between the conductive fill material 80 and the liner 52 or second ESL 30. The metal of the conductive fill material 80 can attach to the dangling bond and/or react with the carbon of the treated surfaces 70 during the deposition of the conductive fill material 80 (e.g., when a precursor is flowed on the treated surfaces 70) and/or subsequent to the deposition of the conductive fill material 80. With the dangling and/or broken bonds of the silicon and/or carbon of the treated surfaces 70, a silicide and/or carbide can be formed at the treated surfaces 70 to enhance nucleation of the conductive fill material 80 and to promote adhesion of the conductive fill material 80 to dielectric layers, such as the liner 52 and the second ESL 30.

In some examples, a metal of the conductive via 60 may form a metal alloy or compound with a metal of the conductive fill material 80 at the treated surface 70 of the conductive via 60. The nucleation enhancement treatment may break bonds at the treated surface 70 of the conductive via 60 to permit the mixing and/or reacting of metals of the conductive via 60 and the conductive fill material 80 at the treated surface 70 of the conductive via 60. The metal of the conductive fill material 80 can mix and/or react with the metal of the conductive via 60 at the treated surfaces 70 during the deposition of the conductive fill material 80 (e.g., when a precursor is flowed on the treated surfaces 70) and/or subsequent to the deposition of the conductive fill material 80. The conductive via 60 and the conductive fill material 80 may be electrically connected without significant resistance caused by the species used in the nucleation enhancement treatment to form the treated surface 70.

Even further, in some examples, a species used in the nucleation enhancement treatment may be embedded in or on the treated surfaces 70, such as by adsorption, diffusion, and/or implantation, and the species may react with the conductive fill material 80. For example, silicon or germanium implanted in the treated surfaces 70 can react with a metal of the conductive fill material 80 to form a metal-semiconductor compound (e.g., silicide or germanocide, respectively). As another example, carbon implanted in the treated surfaces 70 can react with a metal of the conductive fill material 80 to form a metal carbide, or nitrogen implanted in the treated surfaces 70 can react with a metal of the conductive fill material 80 to form a metal nitride. Other compounds can be formed in other examples.

In some examples, a species used in the nucleation enhancement treatment may be embedded in or on the treated surfaces 70 and may remain un-reacted with other material. For example, inert species, such as argon, can remain un-reacted at or proximate to the treated surfaces 70. Un-reacted species can diffuse into the respective dielectric layers. Depending on the nucleation enhancement treatment, a highest concentration of the un-reacted species may be at the treated surface 70 (e.g., of a dielectric layer or the conductive via 60) and decrease from the treated surface 70 in a direction into the respective dielectric layer or the conductive via 60, or can increase from the treated surface 70 in a direction into the respective dielectric layer or the conductive via 60 to a peak concentration before decreasing along that direction, such as when the species is implanted by beam line implantation, plasma doping, or a similar technique.

The extent to which a species used in the nucleation enhancement treatment may be embedded in or on different treated surfaces 70 may depend on the directionality of the nucleation enhancement treatment. For example, a highly directional nucleation enhancement treatment, such as a beam line implantation, can cause some surfaces to have more of the species embedded therein or thereon than other surfaces. Specifically, in some examples, horizontal surfaces (e.g., a top surface of the second ESL 30) can have more of the species embedded therein or thereon than vertical surfaces (e.g., sidewalls of the liner 52). In some examples, multiple directional nucleation enhancement treatments can be performed at different directions to obtain a more even treatment between different surfaces, such as multiple beam line implantations at different implant angles.

Figure 9:
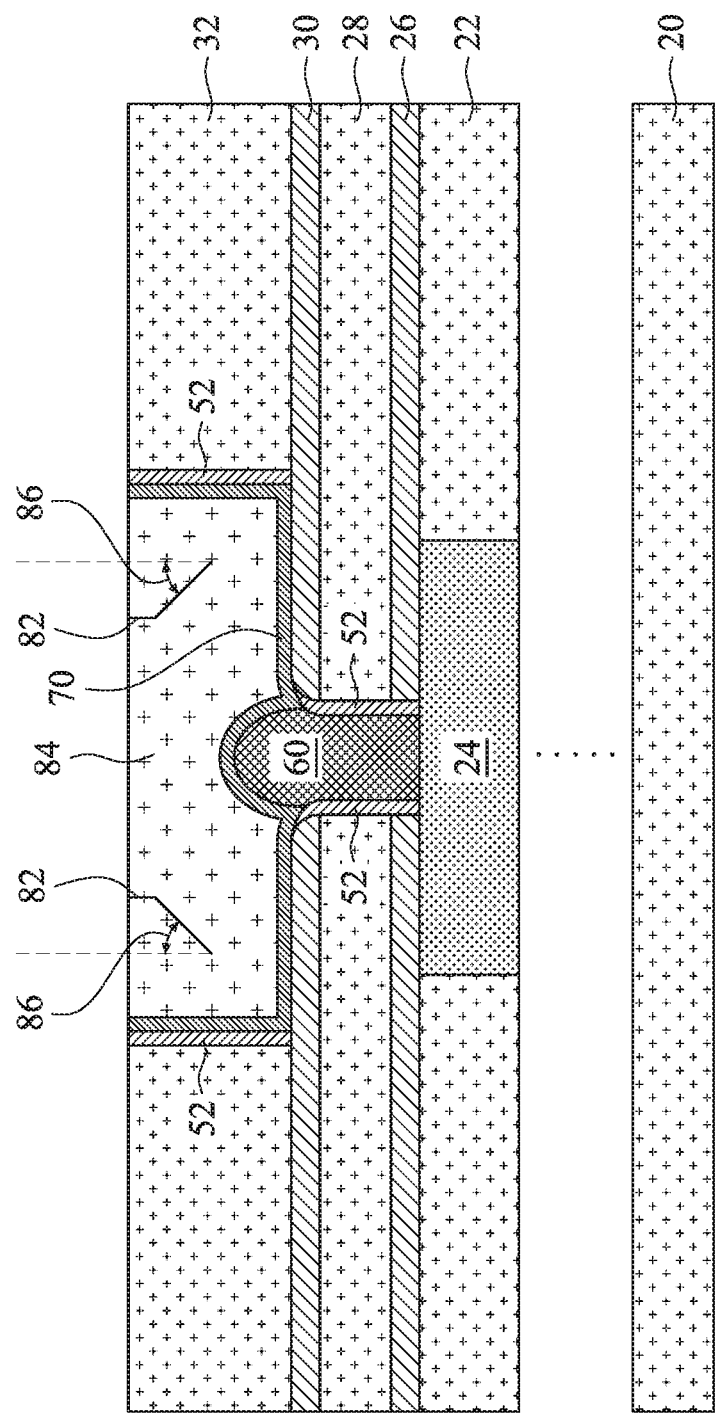

FIG. 9 illustrates the removal of excess conductive fill material 80 to form a conductive line 84 in the third dielectric layer 32. Excess conductive fill material 80 and the treated surface 70 of the third dielectric layer 32 can be removed using a planarization process, such as a CMP. The third dielectric layer 32 may further be thinned by the planarization process, which may remove the rounded corners of the trench 40 in some examples. The third dielectric layer 32 is thinned to a thickness in a range from about 10 nm to about 30 nm in some examples. The removal of the excess conductive fill material 80 and treated surface 70 of the third dielectric layer 32 can form the top surfaces of the conductive fill material 80 and the third dielectric layer 32 to be coplanar. The seams 82, as described above, can remain in the conductive line 84. In some examples, the seams 82 may be cured or removed by an anneal or other thermal process used during processing. An interconnect structure, such as a dual damascene interconnect structure, can be formed, as illustrated in FIG. 9, comprising a conductive via 60 and a conductive line 84.

Figure 10:
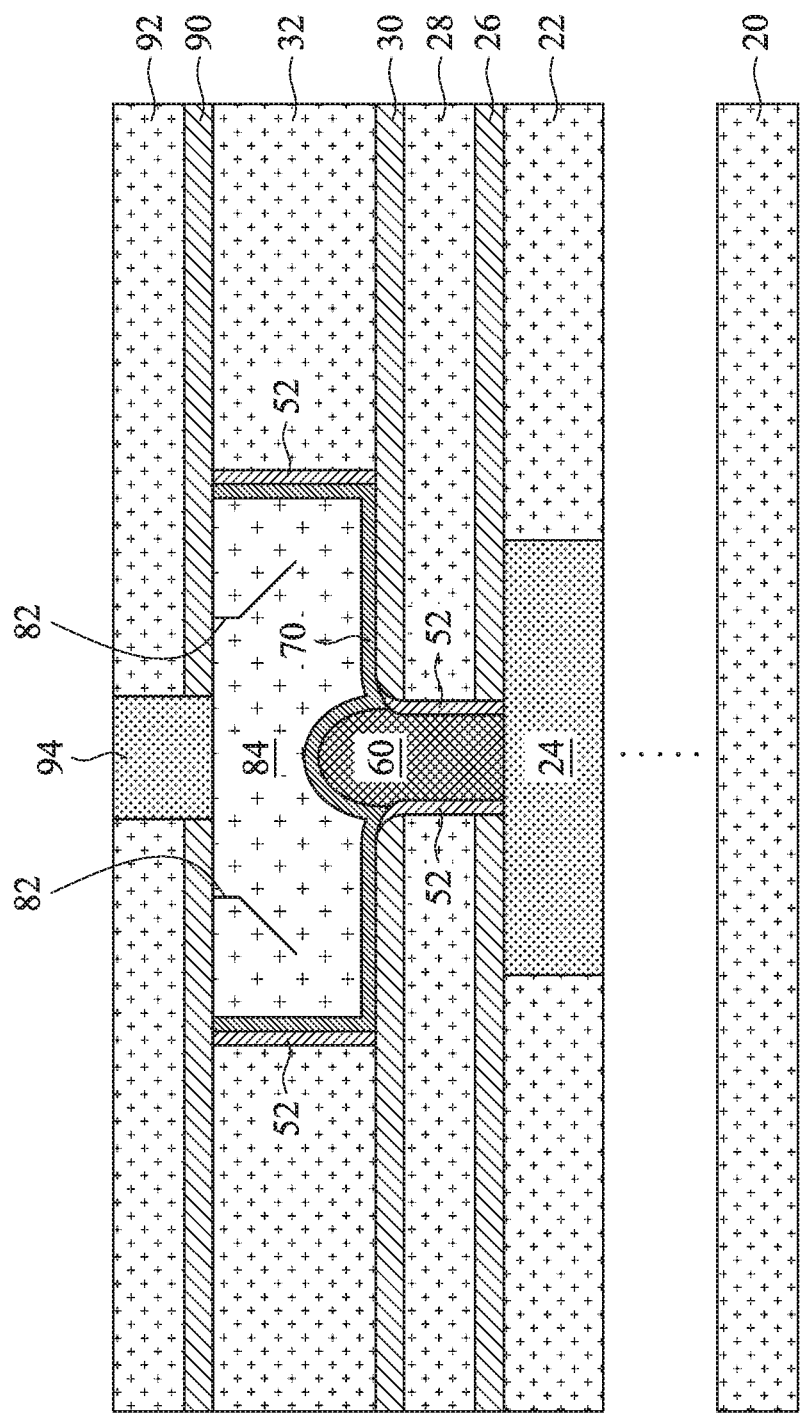
Figure 11:
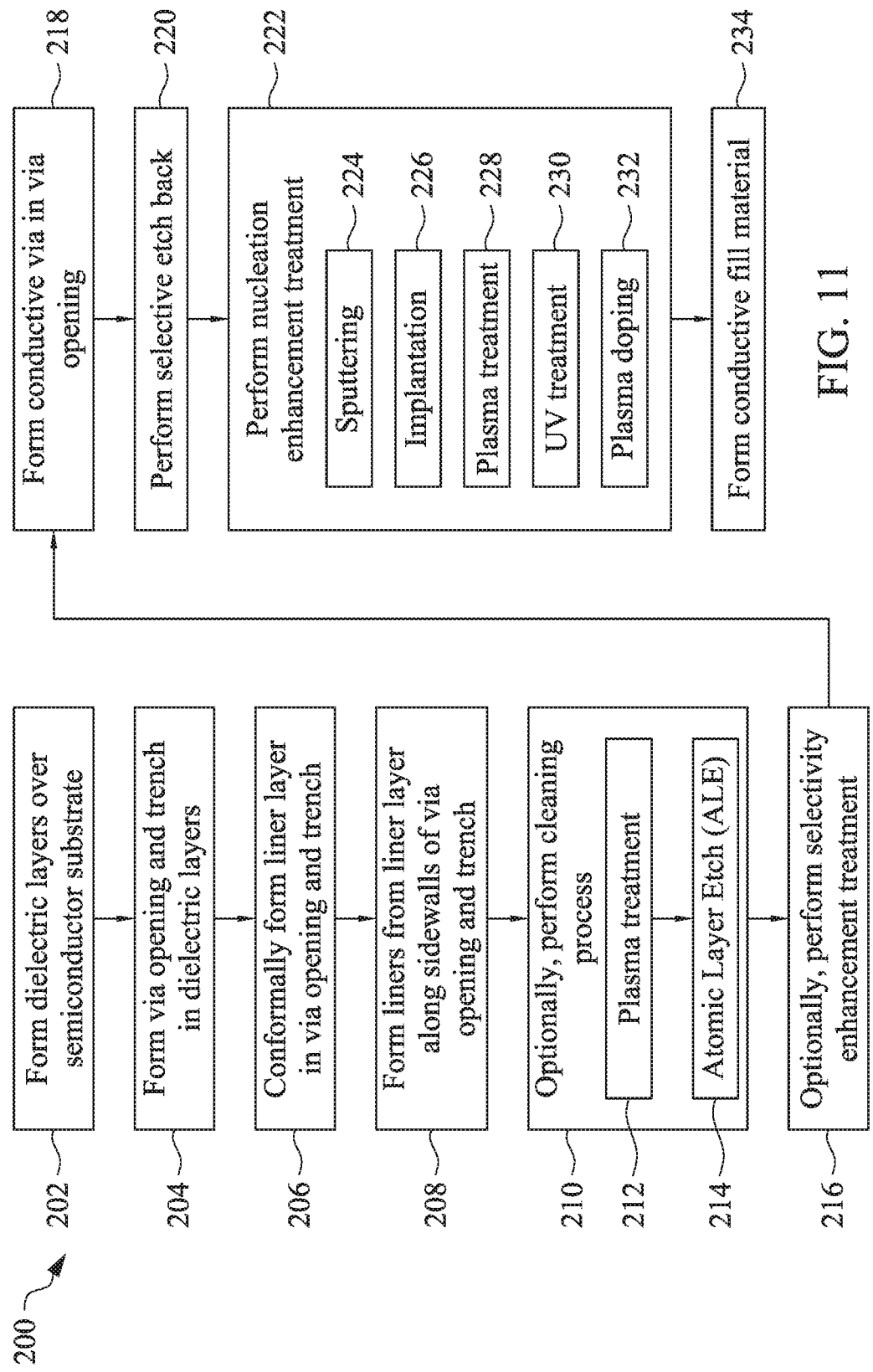
FIG. 11 is a flow chart of an example method for forming an interconnect structure in accordance with some embodiments.

FIG. 10 illustrates the formation of a third ESL 90 and fourth dielectric layer 92 over the third dielectric layer 32, conductive line 84, and liner 52 along the sidewalls of the trench 40, and with a conductive feature 94 through the third ESL 90 and fourth dielectric layer 92 contacting the conductive line 84. The third ESL 90 can be deposited on the third dielectric layer 32, conductive line 84, and liner 52. The third ESL 90 may comprise or be silicon nitride, silicon carbon nitride, silicon carbon oxide, carbon nitride, the like, or a combination thereof, and may be deposited by CVD, PECVD, ALD, or another deposition technique. The fourth dielectric layer 92 is deposited over the third ESL 90. For example, the fourth dielectric layer 92 may be or include an IMD. The fourth dielectric layer 92, for example, may be or comprise a low-k dielectric having a k-value less than about 4.0, such as about 2.0 or even less. In some examples, the fourth dielectric layer 92 comprises silicon oxide, PSG, BPSG, FSG, $SiO_xC_y$, silicon carbon material, a compound thereof, a composite thereof, or a combination thereof. The fourth dielectric layer 92 may be deposited using a CVD, such as PECVD or FCVD; spin-on coating; or another deposition technique. In some examples, a CMP or another planarization process may be performed to planarize the top surface of the fourth dielectric layer 92.

The conductive feature 94 contacting the conductive line 84 may be or include, for example, a conductive via or another conductive feature. The conductive feature 94 may be formed using a damascene process, such as a dual damascene process. For example, the conductive feature 94 may be formed using the process described above with respect to and illustrated in FIGS. 2 through 9 or using a similar process.

As is apparent from the foregoing, a seed layer and a metal-containing barrier layer are not deposited in the described examples for forming the conductive via 60 and conductive line 84. In the illustrated and described examples, no seed layer and no metal-containing barrier layer is deposited (i) between the conductive line 84 and any dielectric layer on or in which it is disposed (e.g., the third dielectric layer 32 or second ESL 30), (ii) between the conductive via 60 and any dielectric layer in which it is disposed (e.g., the second ESL 30, second dielectric layer 28, or first ESL 26), or (iii) between the conductive via 60 and the conductive line 84. Some embodiments can implement a seed layer and/or a metal-containing barrier layer. Further, although a species of the nucleation enhancement treatment may react with a metal of the conductive line 84 (e.g., the conductive fill material 80) and/or the conductive via 60, such as at the treated surface 70 of the conductive via 60 (e.g., an interface between the conductive via 60 and the conductive line 84), the resulting material may be thinner and/or have a lower concentration of the species than a deposited barrier layer, and hence, may, in some instances, not be a diffusion barrier. For example, in some examples implementing a nucleation enhancement treatment, the species can have a concentration of less than or equal to about 5 atomic percent (at. %), such as in a range from about 0.1 at. % to about 5 at. %, in the conductive line 84 (e.g., the conductive fill material 80) and/or the conductive via 60 at the respective treated surfaces. The concentration of the species in the conductive line 84 (e.g., the conductive fill material 80) and/or the conductive via 60 can be discontinuous because of the low concentration of the species therein. Further, the species and conductive material of the conductive line 84 and/or the conductive via 60 may not be in a stable phase of a corresponding compound of the materials (e.g., a metal compound).

FIGS. 13 through 18 illustrate various details and/or modifications to a portion of the cross-sectional view of the intermediate structure of FIG. 6, in accordance with some embodiments. FIGS. 13 through 18 illustrate additional details and/or modifications to the via opening 42 formed in FIG. 2 and the corresponding conductive via 60 formed in the via opening 42 in FIGS. 5 and 6. FIGS. 13 through 18 each illustrate the first ESL 26 over the conductive feature 24, the second dielectric layer 28 over the first ESL 26, and the second ESL 30 over the second dielectric layer 28. Although the via opening 42 is not specifically identified in FIGS. 13 through 18, a person having ordinary skill in the art will readily understand, upon viewing the figures, that sidewalls of the first ESL 26, second dielectric layer 28, and second ESL 30, between which the conductive via 60 is disposed, are sidewalls of the via opening 42 formed in FIG. 2. The via opening 42 in FIGS. 13 through 18 has a first dimension D1 (e.g., a depth) from a top surface of the conductive feature 24 exposed by the via opening 42 to the top surface of the second ESL 30. The first dimension D1 may correspond to a combined thickness of the first ESL 26, second dielectric layer 28, and second ESL 30. The first dimension D1 can be in a range from about 8 nm to about 40 nm, and more particularly, from about 10 nm to about 30 nm, such as about 25 nm.

Figure 14:
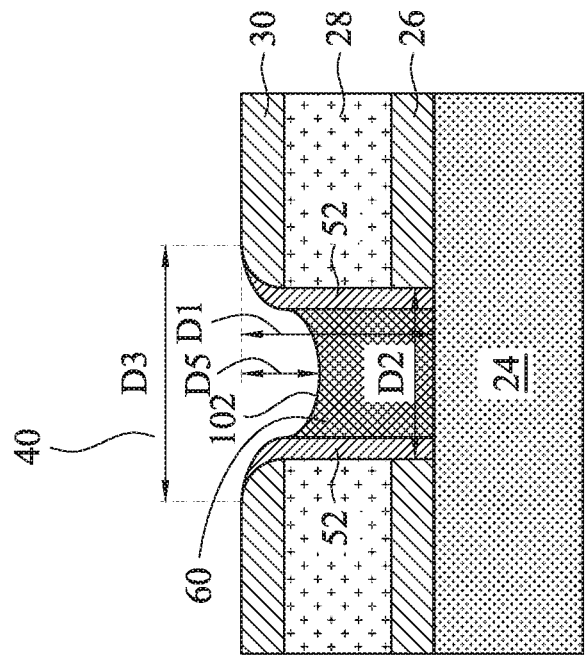
FIGS. 13 through 18 are cross-sectional views of various details and/or modifications to a portion of the intermediate structure of FIG. 6 in accordance with some embodiments.
Figure 13:
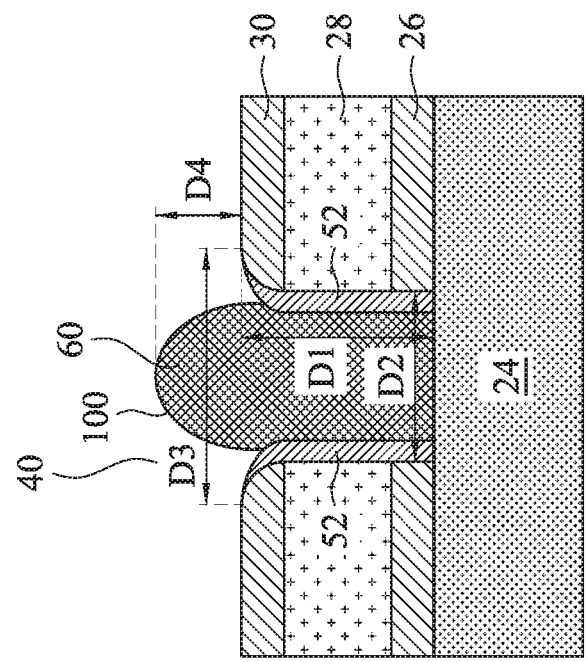

In FIGS. 13 and 14, the via opening 42 has sidewalls (e.g., the sidewalls of the first ESL 26, second dielectric layer 28, and second ESL 30 on which the liner 52 is formed) that are substantially vertical with rounding at upper corners. The via opening 42 has a second dimension D2 (e.g., width) at a bottom of the via opening 42 (e.g., at the top surface of the conductive feature 24) in FIGS. 13 and 14, and has a third dimension D3 (e.g., width) in a plane of a top surface of the second ESL 30. The second dimension D2, in some examples, is in a range from about 8 nm to about 14 nm, and the third dimension D3, in some examples, is in a range from about 13 nm to about 19 nm. A first aspect ratio of the first dimension D1 to the second dimension D2 can be in a range from about 0.7 to about 3.75, and a second aspect ratio of the first dimension D1 to the third dimension D3 can be in a range from about 0.53 to about 2.31.

Figure 16:
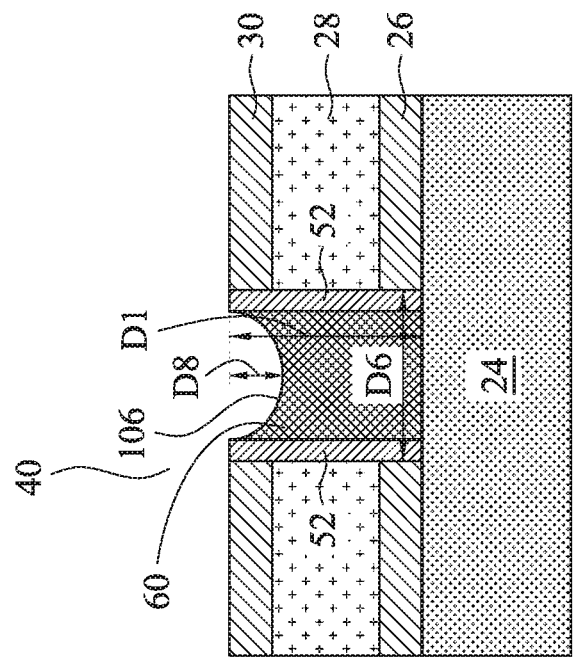
Figure 15:
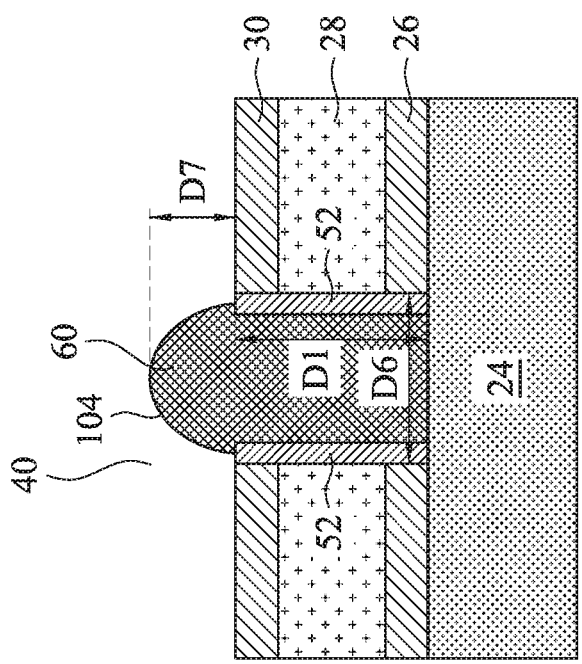

In FIGS. 15 and 16, the via opening 42 has vertical sidewalls (e.g., the sidewalls of the first ESL 26, second dielectric layer 28, and second ESL 30 on which the liner 52 is formed are vertical). Hence, a cross-section of the via opening 42 is rectangular. The via opening 42 has a sixth dimension D6 (e.g., width) at a bottom of the via opening 42 (e.g., at the top surface of the conductive feature 24) in FIGS. 15 and 16. The dimension (e.g., width) of the via opening 42 in a plane of a top surface of the second ESL 30 is equal to the sixth dimension D6 due to the vertical sidewalls. The sixth dimension D6, in some examples, is in a range from about 8 nm to about 14 nm. An aspect ratio of the first dimension D1 to the sixth dimension D6 can be in a range from about 0.7 to about 3.75.

Figure 17:
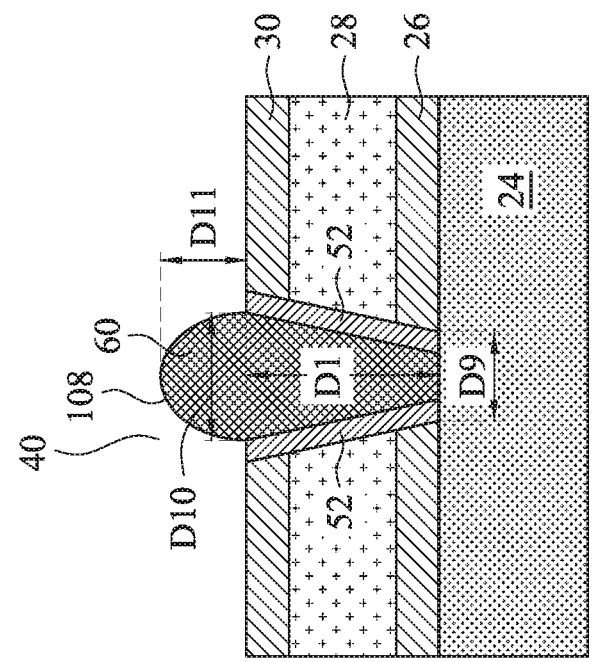
Figure 18:
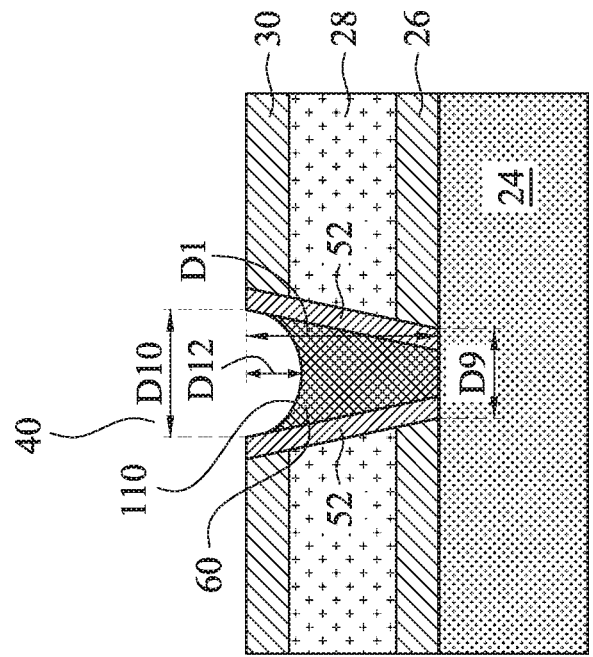

In FIGS. 17 and 18, the via opening 42 has non-vertical or sloped sidewalls (e.g., the sidewalls of the first ESL 26, second dielectric layer 28, and second ESL 30 on which the liner 52 is formed are non-vertical or are sloped). Hence, a cross-section of the via opening 42 can have a positive taper profile, as illustrated, and in other examples, a cross-section of the via opening 42 can be a reentrant profile. The via opening 42 has a ninth dimension D9 (e.g., width) at a bottom of the via opening 42 (e.g., at the top surface of the conductive feature 24) in FIGS. 17 and 18, and has a tenth dimension D10 (e.g., width) in a plane of a top surface of the second ESL 30. The ninth dimension D9, in some examples, is in a range from about 8 nm to about 14 nm, and the tenth dimension D10, in some examples, is in a range from about 13 nm to about 19 nm. A first aspect ratio of the first dimension D1 to the ninth dimension D9 can be in a range from about 0.7 to about 3.75, and a second aspect ratio of the first dimension D1 to the tenth dimension D10 can be in a range from about 0.53 to about 2.31.

In FIGS. 13, 15, and 17, the conductive via 60 has a convex upper surface 100, 104, and 108 (e.g., convex meniscus) that protrudes above the top surface of the second ESL 30. A cross section of the convex upper surface 100, 104, and 108 can be a partial circle (e.g., semi-circular), a partial ellipse (e.g., semi-ellipse), or another shape. The convex upper surface 100, 104, and 108 can have an upper-most point at a level above the top surface of the second ESL 30, for example, and a bottom portion of the convex top surface can be at a level above, at a level of, or at a level below the top surface of the second ESL 30. As illustrated, an upper-most point of the convex upper surface 100, 104, and 108 protrudes above the top surface of the second ESL 30 by a fourth dimension D4, a seventh dimension D7, and an eleventh dimension D11, respectively. The fourth dimension D4, seventh dimension D7, and an eleventh dimension D11 can be in a range from about 0 nm to about the respective second dimension D2, sixth dimension D6, and ninth dimension D9. In other examples, an upper-most point of the convex upper surface 100, 104, and 108 can be at a level of or at a level below the top surface of the second ESL 30.

In FIGS. 14, 16, and 18, the conductive via 60 has a concave upper surface 102, 106, and 110 (e.g., concave meniscus) that is below the top surface of the second ESL 30. A cross section of the concave upper surface 102, 106, and 110 can be a partial circle (e.g., semi-circular), a partial ellipse (e.g., semi-ellipse), or another shape. The concave upper surface 102, 106, and 110 can have a lower-most point at a level below the top surface of the second ESL 30. Upper portions of the concave upper surface 102, 106, and 110 can be at a level above, at a level of, or at a level below the top surface of the second ESL 30. In some examples, a lower-most point of the concave upper surface 102, 106, and 110 is at a level above or at a level of the top surface of the second ESL 30. As illustrated, a lower-most point of the concave upper surface 102, 106, and 110 is below the top surface of the second ESL 30 by a fifth dimension D5, an eighth dimension D8, and a twelfth dimension D12, respectively. The fifth dimension D5, eighth dimension D8, and twelfth dimension D12 can each be in a range from about 0 nm to about two-thirds of the first dimension D1 (e.g., ($2/3$)×D1). In further examples, the top surface can have other shapes, such as being planar, and can be at any level with respect to the top surface of the second ESL 30 and/or another dielectric layer.

Some embodiments may achieve advantages. As previously described, a seed layer and/or barrier layer may be obviated by some embodiments. Without a seed layer and/or barrier layer, resistance of an interconnect structure can be reduced, thereby reducing a resistance-capacitance (RC) delay and increasing device speed. Further, deposition of a conductive fill material in forming the interconnect structure may be by a bottom-up deposition and/or a conformal deposition as a result of the nucleation enhancement treatment. The bottom-up deposition and/or conformal deposition can decrease an amount of time to fill a trench, which can increase throughput during processing and decrease costs. Example embodiments may be applied at any technology node, and may be particularly applicable to advanced technology nodes, such as 20 nm and smaller.

An embodiment is a method. An interconnect opening is formed through one or more dielectric layers over a semiconductor substrate. The interconnect opening has a via opening and a trench over the via opening. A conductive via is formed in the via opening. A nucleation enhancement treatment is performed on one or more exposed dielectric surfaces of the trench. A conductive line is formed in the trench on the one or more exposed dielectric surfaces of the trench and on the conductive via.

Another embodiment is a structure. The structure includes a semiconductor substrate, one or more dielectric layers over the semiconductor substrate, and an interconnect structure disposed in the one or more dielectric layers. The interconnect structure includes a conductive via and a conductive line over the conductive via. The conductive line is disposed over a horizontal surface of the one or more dielectric layers. A same species is disposed at the horizontal surface of the one or more dielectric layers and a surface of the conductive via at an interface between the conductive via and a conductive fill material of the conductive line.

A further embodiment is a method. A dual damascene opening is formed through one or more dielectric layers over a semiconductor substrate. The dual damascene opening includes a trench and a via opening. A conductive via is formed in the via opening. A number of nucleation sites on dielectric surfaces exposed in the trench is increased by breaking chemical bonds of the dielectric surfaces exposed in the trench. A conductive fill material is deposited in the trench by adsorbing the conductive fill material on the increased number of nucleation sites. Depositing the conductive fill material does not include using a seed layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
 forming an interconnect opening through one or more dielectric layers over a semiconductor substrate, the interconnect opening having a via opening and a trench over the via opening;
 forming a conductive via in the via opening;
 performing a nucleation enhancement treatment on one or more exposed dielectric surfaces of the trench and an exposed metal surface of the conductive via to increase a number of nucleation sites on the one or more exposed dielectric surfaces of the trench and the exposed metal surface of the conductive via; and
 forming a conductive line in the trench on the one or more exposed dielectric surfaces of the trench and on the exposed metal surface of the conductive via, the conductive line comprising a single continuous material, wherein forming the conductive line comprises:
  adsorbing the material of the conductive line into the nucleation sites; and
  planarizing the material of the conductive line and an upper dielectric layer of the one or more dielectric layers, wherein a top surface of the upper dielectric layer and a lowest point of a top surface of the conductive line are coplanar after the planarizing.
2. The method of claim 1, wherein forming the conductive line comprises conformally depositing the material of the conductive line in the trench on the one or more exposed dielectric surfaces of the trench and the exposed metal surface of the conductive via.
3. The method of claim 1, wherein forming the conductive line does not include depositing a seed layer for depositing the material of the conductive line, and wherein no metal-containing barrier layer is deposited in the interconnect opening before the conductive line is formed.
4. The method of claim 1 further comprising forming a first dielectric liner on a first sidewall of the via opening and a second dielectric liner on a second sidewall of the trench, wherein:
 the one or more dielectric layers includes an etch stop layer;
 the one or more exposed dielectric surfaces includes a surface of the etch stop layer;
 the via opening is through the etch stop layer; and
 the etch stop layer, the first dielectric liner, and the second dielectric liner form a dielectric diffusion barrier.
5. The method of claim 1, wherein the nucleation enhancement treatment includes sputtering.
6. The method of claim 1, wherein the nucleation enhancement treatment includes a beam line implantation.

7. The method of claim 1, wherein the nucleation enhancement treatment includes a plasma treatment.

8. The method of claim 1, wherein the nucleation enhancement treatment includes an ultra-violet (UV) treatment.

9. The method of claim 1, wherein the nucleation enhancement treatment includes plasma doping.

10. The method of claim 1 further comprising:
before forming the conductive via in the via opening, cleaning the via opening.

11. A method comprising:
forming a dual damascene opening through one or more dielectric layers over a semiconductor substrate, wherein the dual damascene opening includes a trench and a via opening;
forming a conductive via in the via opening;
increasing a number of nucleation sites on dielectric surfaces exposed in the trench by breaking chemical bonds of the dielectric surfaces exposed in the trench; and
depositing a conductive fill material in the trench by adsorbing the conductive fill material on the increased number of nucleation sites, wherein depositing the conductive fill material does not include using a seed layer.

12. The method of claim 11 further comprising:
cleaning dielectric surfaces exposed in the via opening, wherein forming the conductive via comprises depositing the conductive via on the dielectric surfaces exposed in the via opening.

13. The method of claim 12 further comprising:
performing a selectivity enhancement treatment on the surfaces exposed in the via opening and on the surfaces exposed in the trench before forming the conductive via and before depositing the conductive fill material in the trench.

14. The method of claim 11, wherein increasing the number of nucleation sites comprises performing a combination of sputtering, beam line implantation, a plasma treatment, an ultra-violet (UV) treatment, and plasma doping.

15. A method comprising:
forming a conductive feature over a semiconductor substrate;
depositing one or more dielectric layers over the conductive feature;
etching an interconnect opening through the dielectric layers, the interconnect opening having a via opening and a trench over the via opening, the via opening exposing the conductive feature;
cleaning the via opening;
depositing a conductive via in the cleaned via opening;
after depositing the conductive via, nucleating exposed dielectric surfaces of the trench and exposed conductive surfaces of the conductive via; and
depositing a conductive line on the exposed dielectric surfaces of the trench and on the exposed conductive surfaces of the conductive via, the conductive line being a single continuous layer of a first conductive material extending between the exposed dielectric surfaces of the trench.

16. The method of claim 15, wherein the conductive via is a second conductive material, the second conductive material being different from the first conductive material.

17. The method of claim 16, wherein the first conductive material is tungsten and the second conductive material is ruthenium.

18. The method of claim 15, wherein no seed layer is formed between the conductive via and the conductive line.

19. The method of claim 15, wherein depositing the one or more dielectric layers comprises:
depositing a first dielectric layer over the conductive feature;
depositing an etch stop layer over the first dielectric layer; and
depositing a second dielectric layer over the etch stop layer,
wherein etching the interconnect opening comprises:
etching the trench through the second dielectric layer; and
etching the via opening through the etch stop layer and the first dielectric layer.

20. The method of claim 15, wherein depositing the one or more dielectric layers comprises:
depositing a single dielectric layer over the conductive feature,
wherein etching the interconnect opening comprises:
etching the trench through the single dielectric layer; and
etching the via opening through the single dielectric layer.

* * * * *